(12) United States Patent
Fujimoto

(10) Patent No.: US 8,832,361 B2
(45) Date of Patent: *Sep. 9, 2014

(54) STORAGE DEVICE INCLUDING FLASH MEMORY AND CAPABLE OF PREDICTING STORAGE DEVICE PERFORMANCE BASED ON PERFORMANCE PARAMETERS

(71) Applicant: Kabushiki Kaisha Toshiba, Tokyo (JP)

(72) Inventor: Akihisa Fujimoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/962,455

(22) Filed: Aug. 8, 2013

(65) Prior Publication Data

US 2013/0326129 A1     Dec. 5, 2013

Related U.S. Application Data

(60) Continuation of application No. 13/096,731, filed on Apr. 28, 2011, now Pat. No. 8,539,140, which is a division of application No. 11/557,120, filed on Nov. 7, 2006, now Pat. No. 7,953,950, which is a continuation of application No. PCT/JP2005/013104, filed on Jul. 8, 2005.

(30) Foreign Application Priority Data

Jul. 12, 2004   (JP) ................... 2004-204028
Nov. 26, 2004   (JP) ................... 2004-342275

(51) Int. Cl.
G06F 12/06    (2006.01)
G06F 12/02    (2006.01)
G11C 16/20    (2006.01)
G06F 3/06     (2006.01)
G06F 13/38    (2006.01)

(52) U.S. Cl.
CPC ............ *G06F 12/0246* (2013.01); *G11C 16/20* (2013.01); *G06F 3/0679* (2013.01); *G06F 13/385* (2013.01); *G06F 3/061* (2013.01); *G06F 3/0632* (2013.01)
USPC ...... 711/103; 711/112; 711/170; 711/E12.001

(58) Field of Classification Search
CPC ..... G06F 3/061; G06F 3/0629; G06F 12/023; G06F 12/0246; G06F 3/0632; G06F 13/385; G11C 16/20
USPC ................... 711/103, 112, 162, 170, E12.001
See application file for complete search history.

(56) References Cited

U.S. PATENT DOCUMENTS 5,909,592 A    6/1999  Shipman
6,363,008 B1   3/2002  Wong (Continued)

FOREIGN PATENT DOCUMENTS

EP   1 043 729 A   10/2000
JP   6-350907      12/1994

(Continued)

OTHER PUBLICATIONS

Office Action issued Aug. 2, 2011 in Japanese Patent Application No. 2005-198969 (with English translation).

*Primary Examiner* — Pierre-Michel Bataille
(74) *Attorney, Agent, or Firm* — Oblon, Spivak, McClelland, Maier & Neustadt, L.L.P.

(57) ABSTRACT

A storage device includes a semiconductor memory storing data. A controller instructs to write data to the semiconductor memory in accordance with a request the controller receives. A register holds performance class information showing one performance class required to allow the storage device to demonstrate best performance which the storage device supports, of performance classes specified in accordance with performance.

8 Claims, 17 Drawing Sheets

(56) References Cited

U.S. PATENT DOCUMENTS

| | | |
|---|---|---|
| 6,556,952 B1 | 4/2003 | Magro |
| 6,633,956 B1 | 10/2003 | Mitani |
| 6,760,269 B2 | 7/2004 | Nakase et al. |
| 6,772,245 B1 | 8/2004 | Pomerantz et al. |
| 6,914,851 B1 | 7/2005 | Kiehl |
| 6,922,343 B2 | 7/2005 | Nakanishi et al. |
| 6,924,547 B2 | 8/2005 | Kanemoto et al. |
| 6,973,519 B1 | 12/2005 | Estakhri et al. |
| 7,281,097 B1* | 10/2007 | Lawson et al. ............... 711/154 |
| 7,370,168 B2 | 5/2008 | Kanamori et al. |
| 7,467,263 B2* | 12/2008 | Ozaki et al. ............... 711/154 |
| 7,512,751 B2 | 3/2009 | Ellis et al. |
| 7,519,089 B1 | 4/2009 | Winkles et al. |
| 7,543,103 B2* | 6/2009 | Ito ............... 711/112 |
| 7,624,241 B2* | 11/2009 | Eguchi et al. ............... 711/162 |
| 7,739,470 B1* | 6/2010 | Norgren ............... 711/168 |
| 7,809,906 B2* | 10/2010 | Eguchi et al. ............... 711/162 |
| 8,209,504 B2 | 6/2012 | Nakanishi et al. |
| 2002/0085418 A1 | 7/2002 | Goto et al. |
| 2003/0128590 A1 | 7/2003 | Roohparvar |
| 2003/0198028 A1 | 10/2003 | Nakanishi et al. |
| 2004/0080976 A1 | 4/2004 | Hosono et al. |
| 2004/0133758 A1 | 7/2004 | Matsuda |
| 2004/0153471 A1* | 8/2004 | Saika et al. ............... 707/104.1 |
| 2006/0112230 A1 | 5/2006 | Sichert et al. |
| 2007/0058723 A1 | 3/2007 | Chandramouly et al. |
| 2007/0070919 A1 | 3/2007 | Tanaka et al. |

FOREIGN PATENT DOCUMENTS

| | | |
|---|---|---|
| JP | 2002-73409 A | 3/2002 |
| JP | 2002-190000 | 7/2002 |
| JP | 2003-30993 A | 1/2003 |
| JP | 2003-308241 | 10/2003 |
| JP | 2004-23235 | 1/2004 |
| JP | 2004-158953 | 6/2004 |
| WO | WO 2005/015406 A1 | 2/2005 |

* cited by examiner

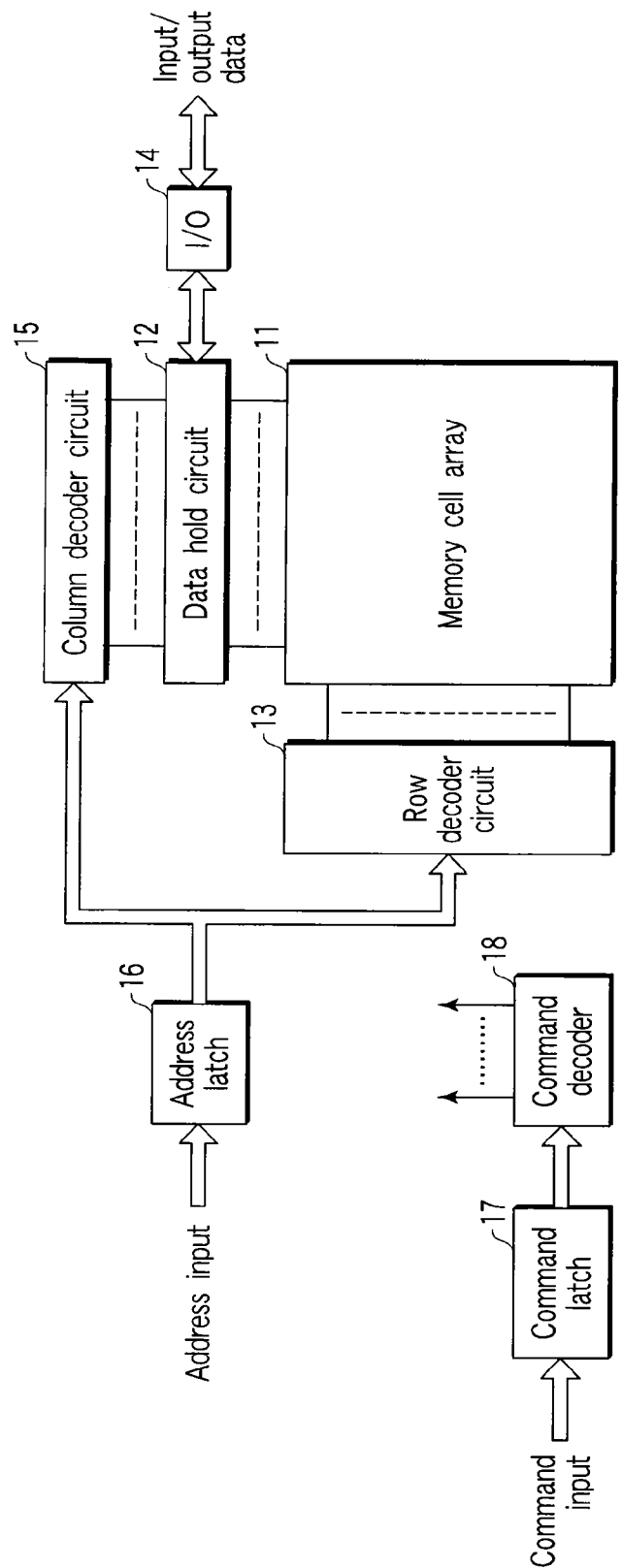
F I G. 1

|  | Pw min. | Pw min. | Pr min. | T$_{FW}$ (ave.) max. | T$_{FW}$ (max.) max. | T$_{FR}$ (4KB.) max. |
|---|---|---|---|---|---|---|
| Class 2 | 2 [MB/s] | 1 [MB/s] | 2 [MB/s] | 100 [ms] | 750 [ms] | 4 [ms] |
| Class 4 | 4 [MB/s] | 2 [MB/s] | 4 [MB/s] | 100 [ms] | 750 [ms] | 4 [ms] |
| Class 6 | 6 [MB/s] | 3 [MB/s] | 6 [MB/s] | 100 [ms] | 750 [ms] | 4 [ms] |

FIG. 11

|  | SD clock frequency (f$_{SD}$) | RU size (S$_{RU}$) |
|---|---|---|
| Class 2 | 20 [MHz] | 16 [KB] |
| Class 4 | 20 [MHz] | 16 [KB] |
| Class 6 | 40 [MHz] | 16 [KB] |
|  | 20 [MHz] | 64 [KB] |

FIG. 12

| Bit area | Bit width | Name | Symbol | Bit definition |
|---|---|---|---|---|
| 447-440 | 8 | PCLASS | - | 0 : Class 0, 1 : Class 2, 2 : Class 4, 3 : Class 6 |
| 439-432 | 8 | PERFORMANCE MOVE | Pm | 1 : 1MB/s, 2 : 2MB/s, ⋯ 255 : Infinity |
| 431-428 | 4 | AU_SIZE | SAU | 1 : 16KB, 2 : 32KB, 3 : 64KB, ⋯ 9 : 4MB |
| 427-412 | 16 | COEFFICIENT FW | CsD | Coefficient of Front-end Process Time |

F I G. 13

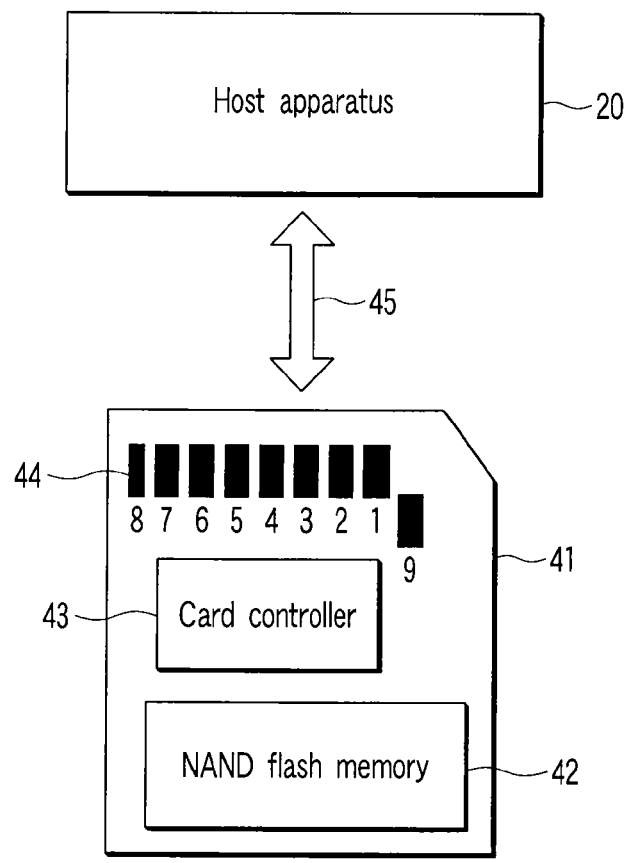
F I G. 17
| Pin No. | Signal |
|---|---|
| Pin 1 | Card detection/data 3 (DAT3) |
| Pin 2 | Command (CMD) |
| Pin 3 | Vss |
| Pin 4 | Vdd |
| Pin 5 | Clock (CLK) |
| Pin 6 | Vss |
| Pin 7 | Data 0 (DAT0) |
| Pin 8 | Data 1 (DAT1) |
| Pin 9 | Data 2 (DAT2) |
F I G. 18

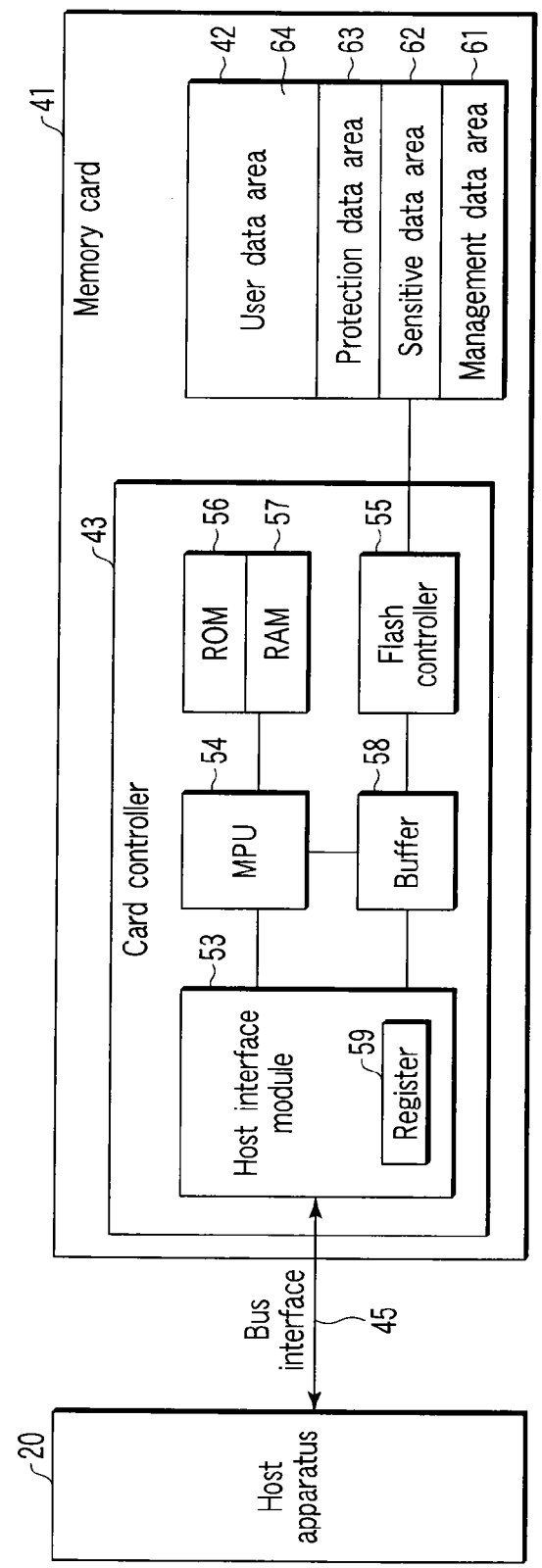
F I G. 19

| | | |
|---|---|---|
| SD 4-bit mode | DAT 3 | CD/DATA |
| | DAT 2 | DATA |
| | DAT 1 | DATA |
| | DAT 0 | DATA |
| | CMD | Command/Response |
| | CLK | Clock |
| SD 1-bit mode | DAT 3 | Reserve |
| | DAT 2 | Non-use |
| | DAT 1 | Non-use |
| | DAT 0 | DATA |
| | CMD | Command/Response |
| | CLK | Clock |
| SPI mode | DAT 3 | Chip select CS |
| | DAT 2 | Non-use |
| | DAT 1 | Non-use |
| | DAT 0 | DATA OUT |
| | CMD | DATA IN |
| | CLK | Clock |

STORAGE DEVICE INCLUDING FLASH MEMORY AND CAPABLE OF PREDICTING STORAGE DEVICE PERFORMANCE BASED ON PERFORMANCE PARAMETERS

CROSS-REFERENCE TO RELATED APPLICATIONS

The present application is a continuation application of U.S. application Ser. No. 13/096,731, filed Apr. 28, 2011, which is a divisional application of and claims the benefit of priority under 35 U.S.C. §120 from U.S. application Ser. No. 11/557,120, filed Nov. 7, 2006, which is a continuation application of PCT Application No. PCT/JP2005/013104, filed Jul. 8, 2005, which was published under PCT Article 21(2) in English, and is based upon and claims the benefit of priority from prior Japanese Patent Applications No. 2004-204028, filed Jul. 12, 2004; and No. 2004-342275, filed Nov. 26, 2004. The entire contents of each of the above are incorporated herein by reference.

BACKGROUND OF THE INVENTION

1. Field of the Invention

The present invention relates to a storage device and a host apparatus (electronic apparatus) using a storage device. In particular, the present invention relates to a storage device such as a non-volatile semiconductor storage device and a memory card using it. In addition, the present invention relates to an electronic apparatus such as a recording apparatus; for example, a digital still camera and a digital video camera having the storage device built in. For example, a storage device such as a universal serial bus (USB) flash and electronic apparatus such as a personal computer (PC) and a personal digital assistant (PDA) are included in the category of the present invention.

2. Description of the Related Art

In recent years, a memory card having a built-in non-volatile semiconductor memory has come into widespread use as a storage device storing various kind of digital information such as image data and music data. The data of the non-volatile semiconductor memory is not at risk of being lost even if power is turned off, and is rewritable. A NAND Flash™ memory is frequently used as a non-volatile memory (for example, see JPN. PAT. APPLN. KOKAI Publication No. 2003-30993).

Recently, the memory capacity of the flash memory has increased with advances in the technique of manufacturing semiconductors.

For example, a storage device such as memory card having a built-in flash memory is used via a host apparatus. In this case, the host apparatus directly controls the flash memory built into the storage device in the conventional case. Thus, the host apparatus grasps program time of the flash memory, and can predict memory performance and storable time to some degree from the program time.

However, it is often now the case that the storage device has a built-in controller; for this reason, the control has become complicated. As a result, it is impossible to predict the memory performance using a simple calculation. The transfer rate parameter of a bus connecting the host apparatus and the storage device is defined. However, this is not the real rate when the host apparatus writes data to the storage device. For this reason, the transfer rate does not function as a means for identifying the performance.

In order to predict the performance of a storage device including a NAND Flash™ memory, calculation is required in combination with a block processing method by the host apparatus. For this reason, it is difficult to determine the performance using only the storage device.

Accordingly, it is desired to provide an electronic apparatus which can simply predict storage device performance to some degree even if a large-capacity storage device is controlled via a controller, a method of predicting the performance, and a storage device.

BRIEF SUMMARY OF THE INVENTION

According to a first aspect of the present invention, there is provided a storage device comprising: a semiconductor memory storing data; a controller instructing to write data to the semiconductor memory in accordance with a request the controller receives; and a register holding performance class information showing one performance class required to allow the storage device to demonstrate best performance which the storage device supports, of performance classes specified in accordance with performance.

According to a second aspect of the present invention, there is provided a host apparatus reading data from a storage device which stores data and performance class information showing one performance class required to allow the storage device to demonstrate best performance which the storage device supports of performance classes specified in accordance with performance, the host apparatus writing data to the storage device, one performance class required to allow the host apparatus to demonstrate best performance which the host apparatus supports of the performance classes being set to the host apparatus.

BRIEF DESCRIPTION OF THE SEVERAL VIEWS OF THE DRAWING

FIG. 1 is a block diagram showing the configuration of a NAND Flash™ memory according to a first embodiment of the present invention;

FIG. 11 is a table showing card requirement characteristics of each class;

FIG. 12 is a table showing measurement conditions of card requirement characteristics of each class;

FIG. 13 is a view showing the contents stored in a register of an SD™ memory card;

FIG. 17 is a view showing the configuration of a memory card according to a second embodiment of the present invention;

FIG. 18 is a table to explain the signal allocation with respect to signal pins in the memory card of the second embodiment;

FIG. 19 is a block diagram showing the hardware configuration of the memory card of the second embodiment;

FIG. 22 is a table to explain signal allocation with respect to SD bus signal pins in various operation modes.

DETAILED DESCRIPTION OF THE INVENTION

Figure 2:
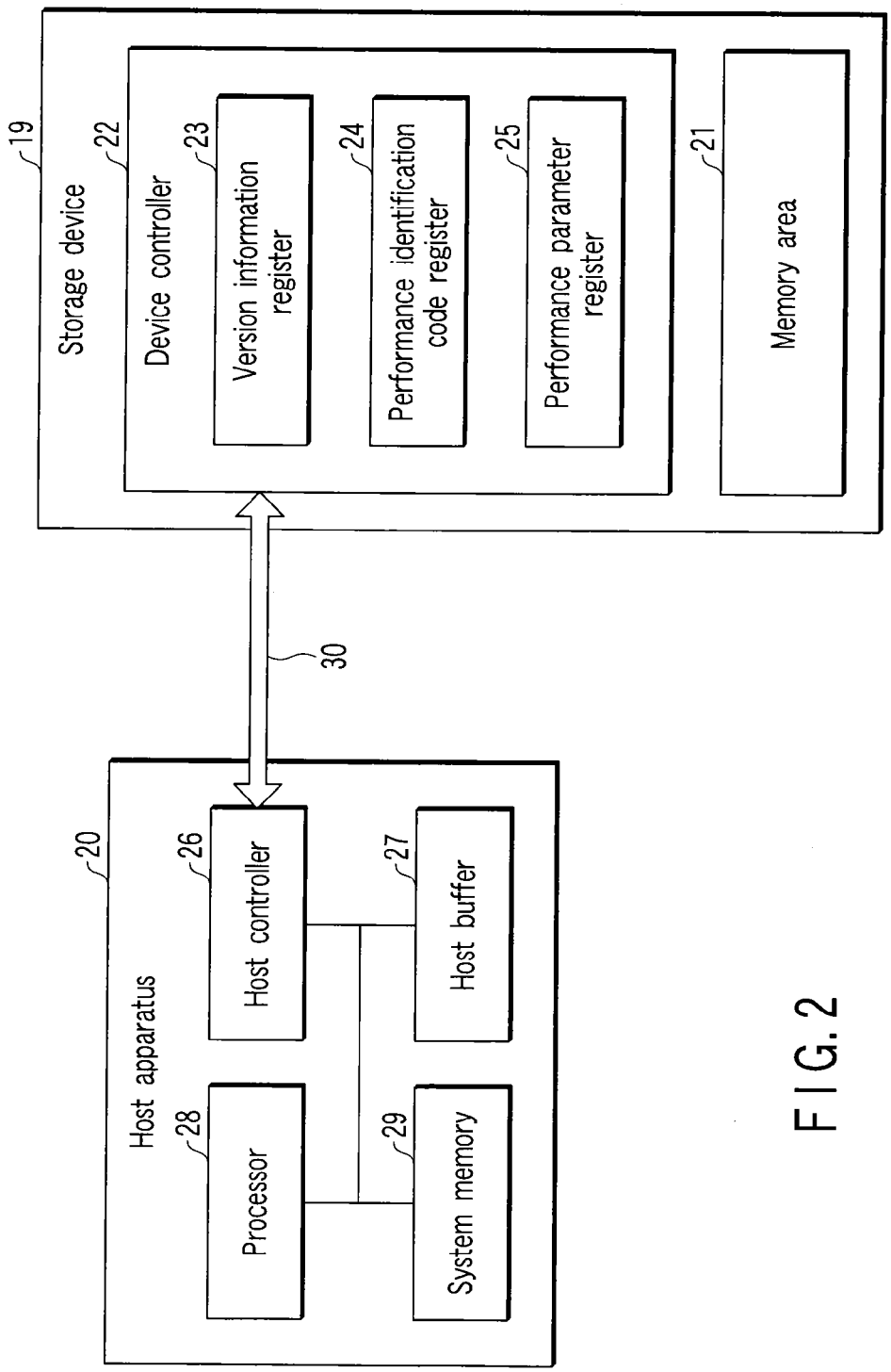
FIG. 2 is a block diagram showing the configuration of a storage device having the built-in memory of the first embodiment, and a host apparatus using the storage device.

Embodiments of the present invention will be described below with reference to the accompanying drawings. These embodiments do not restrict the present invention.

First Embodiment

The first embodiment relates to a storage device having a built-in non-volatile semiconductor storage device, and to a host apparatus using the storage device.

[1] Configuration of Storage Device and Host Apparatus

In the following description, a NAND Flash™ memory is used as a non-volatile semiconductor storage device built in a storage device used for the host apparatus according to the first embodiment of the present invention.

FIG. 1 is a block diagram showing the configuration of a semiconductor storage device (semiconductor memory) in the case of realizing the semiconductor storage device according to the first embodiment using a NAND Flash™ memory.

In FIG. 1, a reference numeral 11 denotes a memory cell array. The memory cell array 11 is provided with several word lines, select gate lines and bit lines (not shown). The several word lines and bit lines are connected to several memory cells (not shown). The several memory cells are divided into several blocks as described later.

The memory cell array 11 is connected to data hold circuit 12 and row decoder circuit 13. The data hold circuit 12 comprises a plurality of latch circuits. The row decoder circuit 13 selectively drives several word lines and select gate lines.

The data hold circuit 12 temporarily holds data read via the bit line in data read from the memory cell array 11. The data hold circuit 12 temporarily holds write data in data write with respect to the memory cell array 11, and then supplies it to the memory cell array 11 via the bit line.

The data hold circuit 12 is connected to input/output buffer (I/O buffer) 14 and column decoder circuit 15. In the data read, read data held in the data hold circuit 12, that is, only selected data is read outside the semiconductor storage device via in accordance with the output of the column decoder circuit 15. In the data write, write data supplied from outside the semiconductor storage device via the input/output buffer 14 is held by a latch circuit of the data hold circuit 12, which is selected in accordance with the output of the column decoder circuit 15.

The row decoder circuit 13 selectively drives the preceding word lines and select gate lines included in the memory cell array 11 in data read and write. By doing so, memory cells corresponding to one page of the memory cell array 11 are simultaneously selected.

An address latch 16 latches address input, and then, supplies row address to the row decoder circuit 13 while supplying a column address to the column decoder circuit 15.

A command latch 17 receives command input. The command latch 17 is connected to a command decoder 18. The command decoder 18 decodes the command to output various control signals. Based on the control signals output from the command decoder 18, the operations of the data hold circuit 12, row decoder circuit 13, input/output buffer 14, column decoder circuit 15 and address latch 16 are controlled.

In the NAND Flash™ memory, the address latch and the command latch are connected to the input/output buffer 14 (not shown). Thus, address and command are supplied from an input/output pin of the NAND Flash™ memory.

The semiconductor storage device is provided with a high-voltage and intermediate-voltage generator circuit (not shown), in addition to the circuits. The high-voltage and intermediate-voltage generator circuit generates a high voltage and intermediate voltage supplied to the row decoder circuit 13 and the memory cell array 11 in data write and erase.

FIG. 2 shows a storage device into which the memory of FIG. 1 is built, and a host apparatus using the storage device. The storage device 19 is a memory card, for example an SD™ memory card. The explanation of the case of using the SD™ memory card will be made later.

As shown in FIG. 2, a flash memory (i.e., memory area 21 in FIG. 2) and a device controller 22 for controlling the flash memory are built in the memory card. The flash memory has the configuration shown in FIG. 1.

The device controller 22 includes version information register 23, performance identification code register 24 and performance parameter register 25. The version information register 23 holds version information. The version information is used for identifying a version of the memory card. The performance identification code register 24 holds a performance identification code. The performance identification code is used for identifying a performance grouping (performance class). The performance parameter register 25 holds a performance parameter (described later) of the storage device.

When the storage device 19 is connected to the host apparatus 20, the host apparatus 20 controls a built-in host controller 26 using a built-in processor 28 to make a data exchange with the storage device 19.

In order to send data from the host apparatus 20, the data is temporarily held in a built-in host buffer (buffer memory) 27, and thereafter, sent to the storage device 19 via the host controller 26. In this case, the host buffer 27 can buffer performance variations of the storage device depending on time to some degree.

The host buffer 27 may be realized using part of a system memory 29. By doing so, there is no need of providing special memory such as the host buffer 27, and in addition, it is effective to reserve it on the system memory 29 because a large host buffer 27 is usually required.

The host apparatus 20 can write data using one-time multi-block write command (i.e., command for writing several continuous blocks using one write command).

[2] Performance Definition of Card Standards

The storage device 19 holds performance class corresponding to self-performance and various performance parameter informations so that the host apparatus 20 can know the performance of the storage device 19. The definition of the performance parameter will be explained below. In the following explanation, a memory card, in particular, SD™ memory card is given as an example of the storage device 19.

Data transfer performance from the host apparatus 20 to the storage device (memory card) 19 is assumed as a transfer rate on control bus 30. In this case, the control bus 30 corresponds to a thick arrow bi-directionally connecting the host controller 26 and the device controller 22 in FIG. 2. The transfer rate is set on the assumption that the host apparatus 20 executes write in the optimum state.

[2-1] Definition of Performance Curve
[2-1-1] Division of Memory Area

First, division of memory area by the host apparatus 20 and the storage device 19 will be explained below. Because this is necessary for the explanation of the performance curve used for specifying a performance class.

The host apparatus 20 divides the memory area 21 into a unit calling 16 kB recording unit (RU) to write data such as video data for each RU. Specifically, the RU (write unit area) is equivalent to a unit written by a one-time multi-block write command.

For example, the RU is the same as a cluster defined by an SD™ file system, or has a size of integer multiples of the cluster.

The unit of the RU may be set as 32 kB, 64 kB, 128 kB, etc. As described later, the host apparatus 20 counts the number of RUs capable of recording data, and thereby, can calculate residual recording time.

Figure 3:
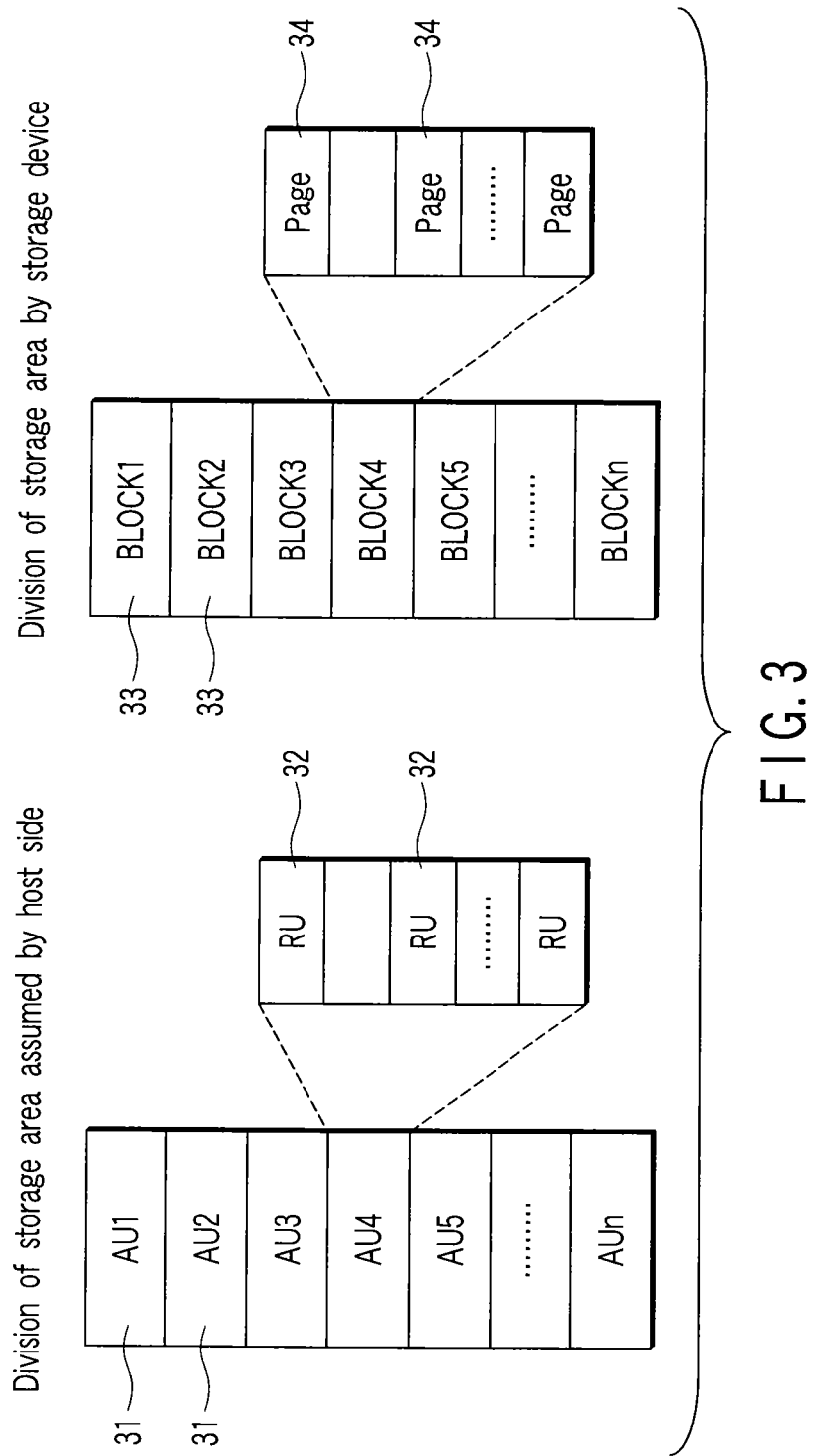
FIG. 3 is a view to explain area division of the storage device assumed by the host apparatus in the first embodiment, and actual memory area division in the storage device.

FIG. 3 shows the division of the memory area 21 assumed by the host apparatus 20, and the actual division of the memory area 21 by the memory card 19. The left side of FIG. 3 corresponds to division of the memory area 21 assumed by the host apparatus 20. On the other hand, the right side of FIG. 3 corresponds to actual division of the memory area 21 by the storage device 19.

As seen from FIG. 3, an RU 32 is a memory unit when viewed from the host apparatus 20. An allocation unit (AU) 31 is defined as a set of several RUs 32. The AU (management unit area) is a management unit, and is defined as a unit used for dividing all memory area 21 of the storage device 19 into an AU size $S_{AU}$.

The relationship between the RU 32 and the AU 31 is similar to the relationship between page 34 and block 33 when viewed the memory area 21 from the storage device 19 (device controller 22). The page 34 is an access unit when the device controller 22 executes write or read with respect to the memory area 21. The block 33 is composed of several pages 34, and is used as a unit when the device controller 22 erases the memory area 21.

For example, if a NAND Flash™ memory TC58512FT manufactured by Toshiba is used as the memory area 21, the size of the page 34 is 512 B, and the size of the block 33 is 16 kB. (In this case, redundancy capacity is ignored for simplification). A NAND Flash™ memory whose page size is 2 kB or 4 kB may also be used. The page 34 and the RU 32 have no need of corresponding with each other. The RU 32 may be set to integer multiples of the page 34. Likewise, the Au size $S_{AU}$ is integer multiples of the RU size. The AU 31 may be set to integer multiples of the block 33. In the following, explanation will be made using RU 32 and AU 31 as a basic unit.

[2-1-2] How to Determine Performance Curve

The performance curve will be described below with reference to FIG. 4 giving the following case as an example. Namely, the host apparatus 20 successively writes RU unit data from the position A to the position B in the memory area 21.

Typically, the area from A to B corresponds to the AU 31. In the following description, data is newly written into the AU including used RU 31 as an example. As shown in FIG. 4, a logic address of the AU 31 is set as LA. When data is newly written to each RU 32 of the AU 31, the following work is actually required. First, data in RU(s) 32 (shown by "Used" in FIG. 4) which holds data in the existing physical block PAA is written into RU(s) 32 of another physical block PAB. Next, new write data must be written thereto. Then, the physical block PAB is newly mapped onto the logic address LA.

Time of newly writing data to RU 32 (shown by "Free" in FIG. 4) which initially holds no data corresponds to write time. The write time is defined as write performance Pw.

On the other hand, when already written data is copied to another RU 32, time is taken to read data from the old RU 32 (e.g., RU 32a) in addition to time of writing data to the RU32 (e.g., RU 32b) of the new physical block PAB.

When the used RU 32 exists in the old physical block PAA, the used RU 32 is skipped and data is written into a free RU32 (e.g., RU with "Data 3"). Data in the used RU 32 need to be written into destination RU 32 (e.g., RU 32b) before new data is written. Write of new data is stopped while the data in the used RU 32 is moved. Time spent for the operation is defined as data move performance Pm.

Thus, the total time spent for writing new data is the sums of the total write time and the total move time. From the foregoing explanation, when average performance P(Nu) is formularized, the following mathematical expression 1 is obtained.

Average performance: [Mathematical expression 1]

$$P(Nu) = [Sc \times (Nt - u)] / \\ [Sc \times (Nt - Nu)/Pw + Sc \times Nu/Pm] = \\ [(Nt - Nu) \times Pm \times Pw] / \\ [(Nt - Nu) \times Pm + Nu \times Pw]$$

where,
Sc: Size of RU
Nt: Total number of RUs successively written from A to B (Number of RUs forming AU)
Nu: Number of used RUs between A and B (number of used RUs included in AU)
Pw: Write performance (unit: MB/sec)
Pm: Move performance (unit: MB/sec)

The foregoing mathematical expression is defined on the assumption that performance is determined using the write performance Pw and the move performance Pm.

The write performance Pw varies depending on program time of the memory card 19 (flash memory [memory area 21]). Moreover, the write performance Pw is defined as the lowest value of an average of the performance when write is continuously executed to all RUs 32 of AU 31 which consists of free RUs 32.

Figure 5:
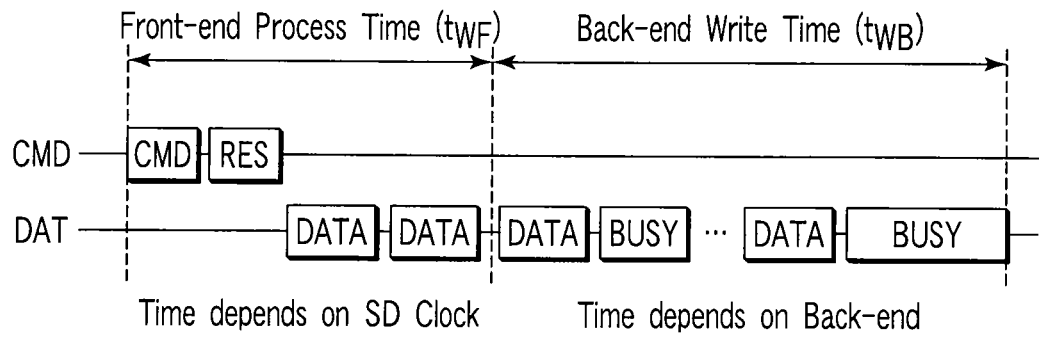
FIG. 5 is a view to explain the write operation timing when using a multi-block write command.

Note that the write performance varies depending on process time consumed by the front-end. The front-end process time depends on SD clock frequency giving the SD™ memory card as an example. This matter will be described below. FIG. 5 is a view showing the write operation timing when a multi-block write command is used. In the first stage of the write operation, the back-end is waiting until write data arrives from the front-end. In the second stage, the back-end is operated together with the front-end. Therefore, write time consumed for the multi-block write must be considered independently from front-end and back-end.

In the second stage, back-end write time dominates the write time as compared with front-end process time.

Back-end write time $t_{WB}$ is the sum of time until all write is completed after write to the flash memory (memory area 21) is started.

On the other hand, front-end process time $t_{WF}$ is the sum of time from the start of the multi-block write command to the start of write to the flash memory.

As described above, if the SD™ memory card is given as an example, the front-end process time $t_{WF}$ depends on the SD clock frequency. Therefore, the front-end process time $t_{WF}$ is expressed using coefficient $C_{SD}$ and SD clock frequency $f_{SD}$. Thus, the front-end process time $t_{WF}$ is expressed using the following mathematical expression 2 in the SD™ memory card.

$$\text{Front-end process time:} t_{WF} = C_{SD}/f_{SD} \quad \text{[Mathematical expression 2]}$$

If data is recorded to one AU 31, the front-end process time $t_{WF}$ is proportional to the number of write commands. The number of write commands is equivalent to the number $N_{RU}$ of RUs 32. If the number $N_{RU}$ increases, that is, the RU size $S_{RU}$ becomes small, write efficiency decreases.

The move performance Pm is defined as the lowest value of an average move performance. The move performance Pm is calculated as an average when continuous RUs 32 are moved to form one completed AU 31. The move time is defined on the side of the back-end, and is not affected by the SD clock frequency. If the memory card 19 has no need of moving the RU 32, the move performance Pm is defined as being infinite. This is expressed as "1/Pm=0".

Moreover, the move performance Pm varies depending on read time described later and data move in addition to the program time of the flash memory. In this case, the data move is executed inside the memory card 19; therefore, the host apparatus 20 does not directly control the data move.

The following two values are defined when it comes to read performance.

1) Read Performance with Respect to Data

Read performance with respect to data (hereinafter, referred to as read performance) Pr is defined as the lowest value of an average of performance when reading data in units of RU 32 at random. The average may be calculated based on 256-time random reads in units of the RU 32. Moreover, the worst case should be considered in the time spent for making corrections using an error correcting code (ECC) with respect to each block 33. The read performance Pr must be larger than or at least equal to the write performance Pw 2) Read Time of File System (FAT)

Read time $T_{FR}$(4 kB) of file system such as a file allocation table (FAT) is defined as the maximum time when reading a 4 kB FAT. In this case, FAT read must be possible during AU write. This is because, considering the case of real time recording, the host apparatus 20 must read out FAT between AU writes. Moreover, the worst case should be considered in the time spent for making corrections using an ECC with respect to each block 33. FAT read time with respect to file system size (FR size) $S_{FR}$ is expressed using CEIL function as follows.

FAT read time with respect to file system size $S_{FR}$ [kB]:

$$T_{FR}(S_{FR}) = \left\lceil \frac{S_{FR}}{4kB} \right\rceil \cdot T_{FR}(4kB)$$

$\lceil x \rceil$ represents the CEIL function which converts decimal fraction x to the smallest integer more than or equal to x.

Figure 6:
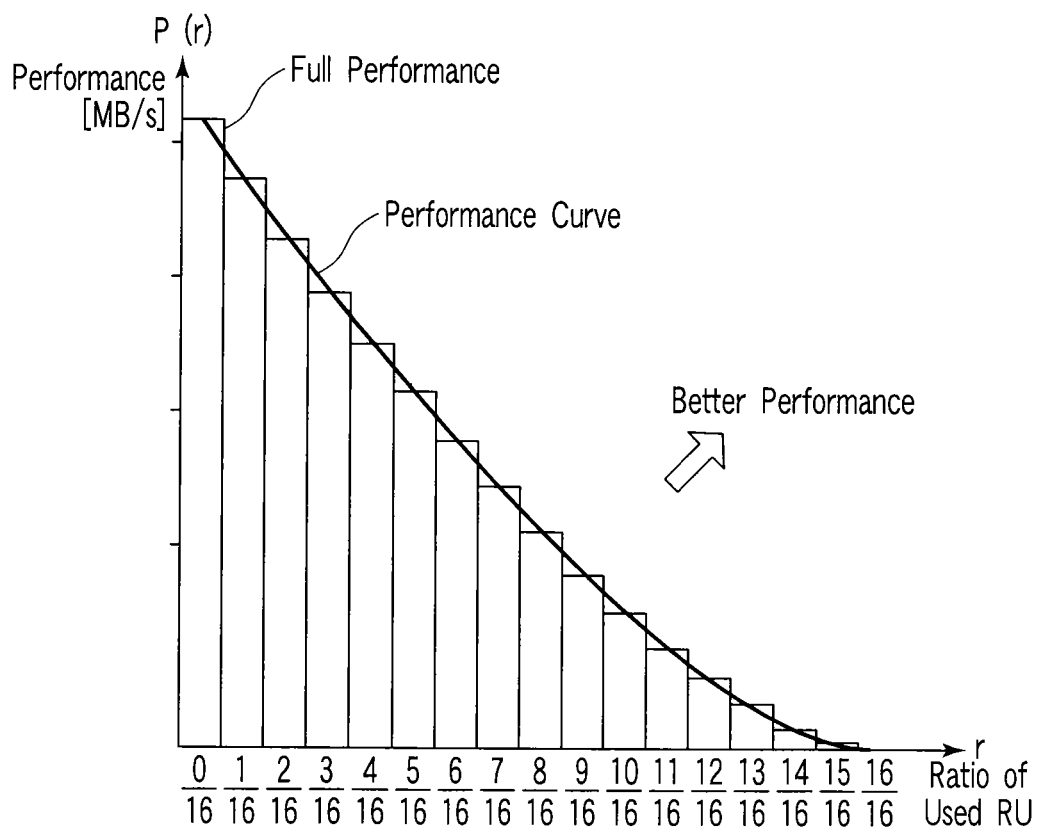
FIG. 6 is a view showing an example of a performance curve in the first embodiment.

FIG. 6 shows the performance of the memory card 19 calculated according to the mathematical expression 1. In FIG. 6, there is shown the performance when the number Nt of RUs 32 forming the AU 31 is set as 16.

As seen from FIG. 6, performance (vertical axis) is determined for each used RU ratio r (horizontal axis). Then, the performance of each used RU ratio r is connected, and thereby, a performance curve is obtained. The performance curve is significant information to host apparatus makers.

The performance curve is specified using the write performance Pw and the move performance Pm. The write performance Pw is equivalent to full performance when the used RU ratio r=0.

The used RU ratio r is expressed as the following mathematical expression using the number of Nt of RUs 32 of the AU 31 and the number Nu of used RUs 32.

$$r=Nu/Nt$$

This equation is also expressed as follows.

$$Nu=r\times Nt$$

The used RU ratio r varies in a range from 0 to 1. When r=0, this means that all RUs 32 are unused. On the other hand, when r=1, this means that all RUs 32 are used, that is, performance is 0; in other words, P(1)=0 is given.

It can be seen that any performance curves passes through the point (1, 0). When rewriting the mathematical expression 1 using "r", the following mathematical expression 3 is obtained.

$$\text{Average performance curve:} P(r)=[(1-r)\times Pw\times Pm]/[r\times Pw+(1-r)\times Pm] \quad \text{[Mathematical expression 3]}$$

Where, 0≤r≤1

The performance is plotted using the expression 3, and thereby, the performance curve shown in FIG. 6 is obtained.

[2-1-3] Position of Memory Area and Performance Accuracy

If the data write start address of the RU 32 is not the boundary of the block 33 of the memory area 21, the following time is required. Specifically, time for moving written data is required so that the write start position corresponds to the boundary of the block 33. For this reason, actual performance is inferior to expected performance in the case. In order to measure accurate performance, it is necessary to satisfy the requirements that addresses A and B correspond to the boundary of erase unit (block 33). Specifying the allocation unit results from the reason described above.

[2-2] Parameter Relevant to File System Update During Recording

File system update is inserted into the write sequence, and thereby, general (actually obtained) write performance decreases. For this reason, the host apparatus 20 requires parameters relevant to file system update when calculating the performance of the memory card 19 as described later. The host apparatus 20 can calculate the reduction of actual performance by the influence that the file system update is inserted into the write sequence.

Figure 7:
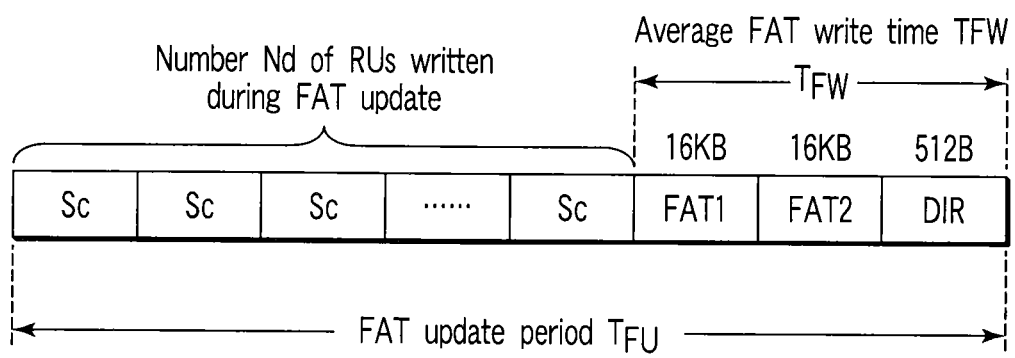
FIG. 7 is a view to explain file system update during real time recording in the first embodiment.

FIG. 7 shows a typical sequence of file system update during real time recording. In the following description, FAT is used as a typical example of the file system.

The update of the file system (FAT) possibly occurs after any write to RUs 32. FAT is periodically updated. The number of RUs 32 written between certain file system update and the next file system update is specified by file system update period $T_{FU}$. The number of RUs 32 written between the file system updates is Nd.

A FAT write cycle comprises three write operations. In FIG. 7, FAT1 and FAT2 denote FAT information write to FAT1 and FAT2 using one multi-block write command, respectively. File system (FAT) write may be started from arbitrary byte address, and may be defined as write ranging from 16 kB to arbitrary length.

In FIG. 7, DIR denotes Directory Entry. The DIR is generated prior to recording, and write is made to only 512B portion having change directory entry. File system write time $T_{FW}$ is defined as the total time of file system write cycle, that is, the total write time of the FAT1, FAT2 and DIR. The file system write time $T_{FW}$ changes depending on the specifications of the device controller 22.

[2-2-1] Conditions of Measuring an Average of File System Write Time $T_{FW}$

The File system write time $T_{FW}$ is defined as a value obtained from the average of some measuring values. The following mathematical expression 4 is used for specifying average file system write time $T_{FW}(ave.)$. As seen from the following mathematical expression 4, the worst value of the average value of arbitrary eight-time file system write cycles is used as the average file system write time $T_{FW}(ave.)$ Average file system write time:$(T_{FW}(ave.))$=
[max$(T_{FW}(1)+T_{FW}(2)+ \ldots$
$T_{FW}(7)+T_{FW}(8))]/8$      [Mathematical expression 4]

[2-2-2] Maximum File System Write Time

As described later, the host apparatus 20 temporarily holds data using the host buffer 27 during file system update. Thus, the maximum file system update period needs to be considered when determining the minimum size of the host buffer 27. The requirements on the size of the host buffer 27 will be explained in the following [4-5].

The following mathematical expression 5 is used to specify the worst value of the file system (FAT) write time.

Worst value of file system (FAT) write time:$(T_{FW}$
(max))750 [ms]      [Mathematical Expression 5]

[2-2-3] Independence of Data Write and File System Write

File system write may be inserted between any Rus or AUs during real time recording. The device controller 22 needs to be able to control without influencing the write performance Pw of data itself.

The influence of the file system write to the write performance Pw may be eliminated in the following manner. Specifically, the resumption of write after interruption on writing by the file system write is carried out from an physical area following the one to which data is written last before interruption.

Figure 8:
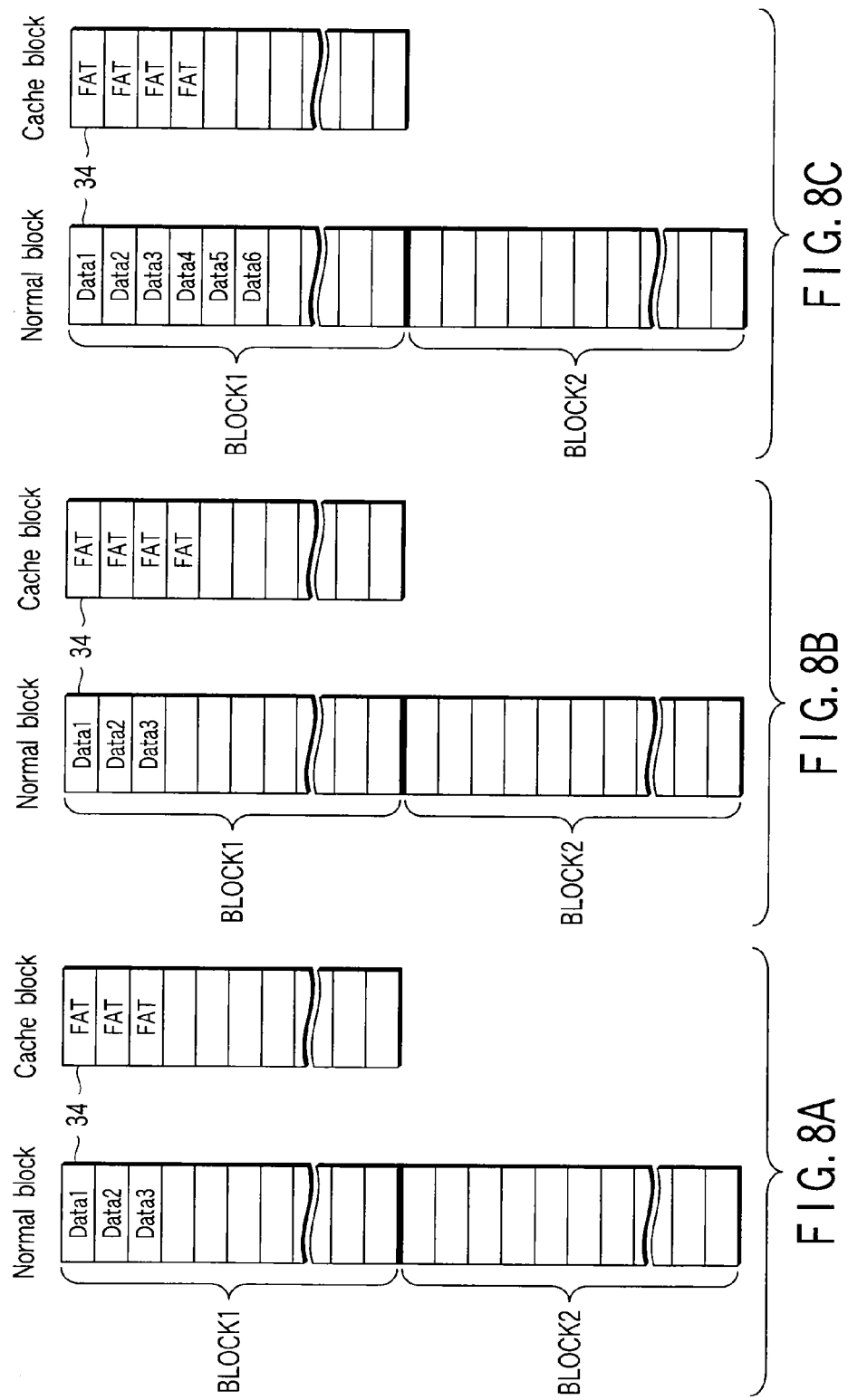
FIGS. 8A to 8C are views showing the write sequence.

In order to realize the control, a cache block for file system write may be provided and the device controller 22 may control as described below. As shown in FIG. 8A, the memory area 21 includes a normal physical block and a cache block. When a file system write is requested during sequentially writing continuous data to a normal physical block as shown in FIG. 8A, file management information is successively written to a free area (page 34) of the cache block as depicted in FIG. 8B. Thereafter, as seen from FIG. 8C, data write is restarted from an area (page 34) following the one to which data is written last before interruption.

When write of the interrupted data write is resumed on a physical area which is not the next one of the physical area (e.g., area in a new block, or BLOCK2) to which data is written last before resumption like the prior art, data move accompanying write occurs. As a result, the write performance Pw varies due to the file system write.

Investigating address, size and sequence makes it possible to classify normal data and file management information.

[3] Classification of Memory Card

In order to readily match the performance of the memory card 19 and the performance required by the host apparatus 20, the memory card 19 is classified into several classes (performance classes) in accordance with the card performance. The class may be classified in accordance with performance parameters such as the performance curve described before and file system write time $T_{FW}$. The device controller holds the class information as a performance identification code 24 of the memory card 19.

Figure 9:
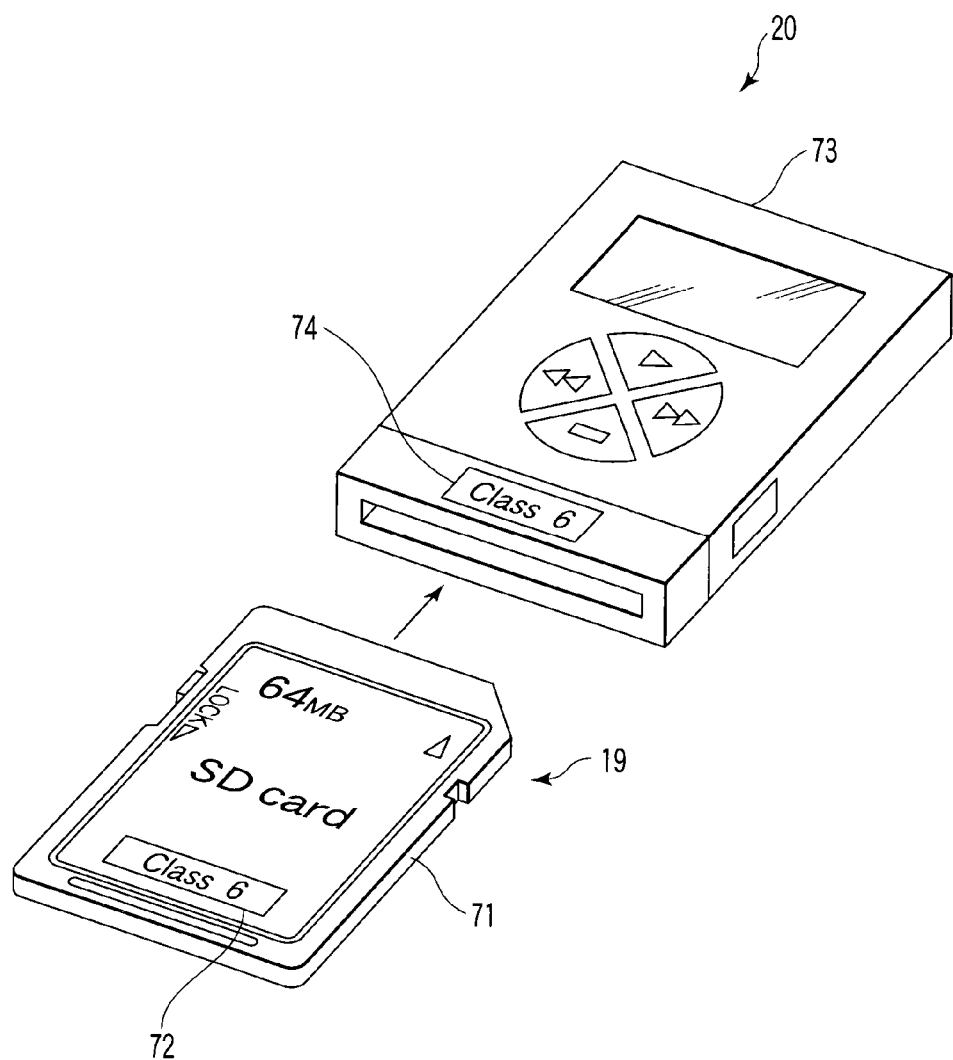
FIG. 9 is a perspective view showing the appearance of the host apparatus and storage device according to the first embodiment.

The memory card 19 displays its own class according. In FIG. 9, there is shown a label displaying the class identification. FIG. 9 shows the case where the storage device 19 is an SD™ memory card.

As seen from FIG. 9, the memory card 19 has case 71 and label 72 displaying its class on the case 71. The case 71 at least partially covers the memory area 21 and device controller 22.

Moreover, the host apparatus 20 has a preset class. The class in the host apparatus 20 means that it can perform the best when it uses a memory card 19 with the same class as the host apparatus 20. The host apparatus 20 can record information when it uses a lower class memory card 19 though its performance is not the best. FIG. 9 shows that a case 73 of the host apparatus 20 has a label 74 displaying its class on it. The host does not necessarily show its class.

[3-1] Request from Application

Application in the host apparatus 20 requests high performance to the memory card 19 used by the application. Typical examples will be described below.

(1) Digital Video Recording

In MPEG2 and Motion JPEG, direct recording to the memory card 19 is required. A card performance of about 2 MB/sec is required in order to obtain standard television image quality and resolution. A card performance of about 4 MB/sec is required to record high quality image.

(2) Digital Still Camera Having Continuous Shooting Function

Digital still camera makers requires the memory card 19 having high performance in order to realize a continuous shooting function. The digital still camera makers can use the card performance and the control method of the host apparatus to calculate an available continuous shooting rate to the user.

[3-2] Classification

Figure 10:
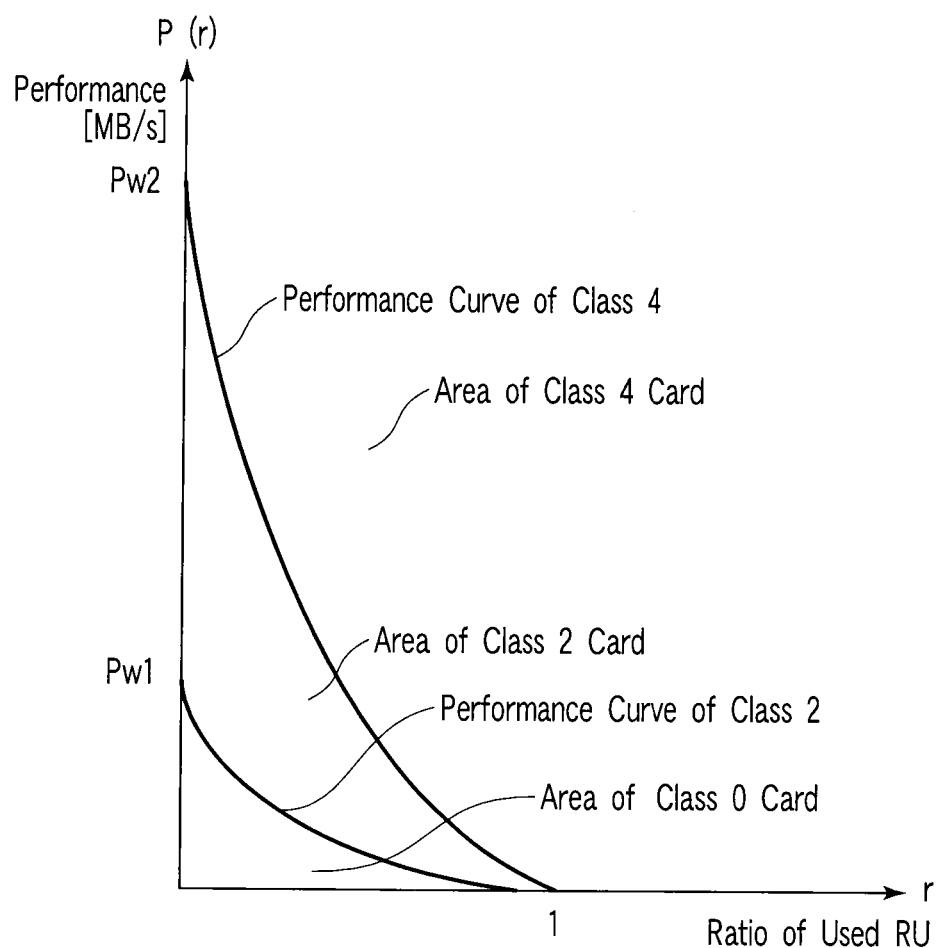
FIG. 10 is a view showing the performance curve classification in the first embodiment.

FIG. 10 is a graph to explain the relationship between performance curve and class. In FIG. 10, there are three areas divided by two performance curves. As seen from FIG. 10, the area formed by the vertical axis P(r) and the horizontal axis r is divided into three areas by performance curves of class 2 and class 4. The vertical axis P(r) represents performance and the horizontal axis r, a used RU ratio.

Conventional memory cards belong to the area nearest to the origin in the three areas, that is, a class 0 (Area of Class 0 Card in FIG. 10). In FIG. 10, the area includes memory cards having the lowest performance.

The performance curve of class 2 implies the lowest performance of class 2 cards. This performance curve is specified by two parameters Pw1 (the intersection of the performance curve of class 2 and the Y-axis) and Pm1.

Likewise, the performance curve of class 4 implies the lowest performance of class 4 cards. This performance curve is specified by two parameters Pw2 (the intersection of the performance curve of class 4 and the Y-axis) and Pm2.

When the application makes a further enhanced request, performance curves of class 8, class 10 having higher level must be specified. However, there is no need of changing the concept. If the performance curve of class 8 is defined, an area of class 6 occupies an area indicating higher performance than the class 6 performance curve and lower one than the class 8 performance curve. An area of class 8 occupies an area indicating higher performance than the class 8 performance curve.

FIG. 11 is a table showing characteristics required for each class. Parameters required for class 2 (CLASS2), class 4 (CLASS4) and class 6 (CLASS6) cards are as follows and as shown in FIG. 11.

CLASS2: Pw=2 [MB/sec], Pm=1 [MB/sec], Pr=2 [MB/sec]
CLASS4: Pw=4 [MB/sec], Pm=2 [MB/sec], Pr=4 [MB/sec]
CLASS6: Pw=6[MB/sec], Pm=3[MB/sec], Pr=6[MB/sec]

The average file system write time $T_{FW}$(ave.), maximum file system write time $T_{FW}$(max) and file system read time $T_{FR}$(4 kB) are the same parameter in each class; for example, 100 [ms], 750 [ms] and 4 [ms], respectively.

According to parameters shown in FIG. 11, the performance curve of class 2 card intersects with the Y-axis at the point 2 [MB/sec] and with the X-axis at the point 1 and gets closer to the origin in the middle. An area of class 2 occupies an area indicating higher performance than the class 2 performance curve and lower one than the class 4 performance curve (described below) in the first quadrant.

Likewise, the class 4 card performance curve intersects with the Y-axis at the point 4 [MB/sec] and with the X-axis at the point 1 and exits further away from the origin than the performance curve of class 2 card. The area of the class 4 card is an area on the side opposite to the origin of the performance curve of the class 4 card.

Likewise, the performance curve of class 6, which intersects with the Y-axis at the point 6 [MB/sec], is defined.

FIG. 12 is a table showing measuring conditions of the card request characteristics of each class shown in FIG. 11. As described above, front-end process time $t_{WF}$ and RU size $S_{RU}$ affects the write performance Pw. The SD clock frequency $f_{SD}$ affects the front-end process time $t_{WF}$. The SD clock frequency $f_{SD}$ and the RU size $S_{RU}$ are set to values shown in FIG. 12 as a condition of measuring the request characteristics of each class. The host apparatus 20 is desirable to access the memory card 19 using larger RU size in order to enhance the performance.

[3-3] Relationship Between Capacity and Maximum AU Size

The host apparatus 20 makes a request of another parameter relevant to the block size. A register sending the AU size $S_{Au}$ is specified according the physical standards of the memory card 19. Then, the memory card can show its optimum AU size $S_{Au}$ to the host apparatus 20. As a result, the host apparatus 20 effectively uses the AU 31. A size required for the host buffer 27 is specified according to the maximum value of the AU 31 as described below.

The maximum AU size corresponding to the capacity of the memory card 19 may be as follows.

Card capacity/maximum AU size=16 to 128 MB/128 kB, 256 MB/256 kB, 512 MB/512 kB, 1 GB/1 MB, 2 GB/2 MB, 4 to 32 GB/4 MB

[3-4] Read Performance Request

Read performance of at least 2 [MB/sec], [MB/sec] and 6 [MB/sec] for the class 2, 4 and 6 cards are respectively specified when read is executed in units of RU 32. However, this does not assure the read performance of the host apparatus 20. This is because the environment of the host apparatus 20 is not taken into consideration in the foregoing explanation.

[3-5] Requirements of Specifying the Physical Standard of Cards

When the performance is specified using the class and various parameters and standardized, the performance standard needs to include both current and next generation standards. Therefore, the performance standard must include the next generation memory card in addition to the foregoing standards. Thus, in the current SD™ memory card, parameters such as write performance Pw, move performance Pm and file system write time $T_{FW}$ must be specified in conformity to the physical standard 1.01, 1.10.

A certain class (e.g., high class defined in future) memory card 19 is given. The class memory card is not manufactured in conformity to a certain physical standard (e.g., physical standard 1.01) because there exists a restriction of the condition (e.g., SD clock frequency) required for defining the class. This kind of memory card 19 must be manufactured in conformity to a higher physical standard. For example, class 6 cards can not be manufactured in conformity to a the physical standard 1.01 because they are equipped with a high speed mode. Therefore, they need to conform to the physical standard 1.10.

[3-6] Holding Data of Class and Parameters

According to the novel standard, the register may hold class, AU size $S_{AU}$, move performance Pm and coefficient $C_{SD}$ as status information of the memory card. More specifically, the class is stored in the performance identification code register 24. The AU size $S_{AU}$, move performance Pm and coefficient $C_{SD}$ are stored in the performance parameter register 25.

As described above, the memory card 19 holds the class and parameters. Then, the host apparatus 20 capable of identifying the class can more accurately calculate performance while effectively using the memory card 19.

FIG. 13 is a table showing bit width of register information in the SD™ memory card. In the SD™ memory card, AU size $S_{AU}$, move performance Pm and coefficient $C_{SD}$ are described in the performance parameter register. These data may be recorded to separately prepared register. The fields for these data may hold 0 in a memory card which does not support the performance standard. Such a memory card is recognized as class 0 card.

The class information may be set in the field which holds the fixed value (e.g., 0) in the conventional storage device. Thus, conventional devices, which does not support the present embodiment, may be identified as being out of the object of the performance classification.

Note that the write performance Pw is unique in each class (write performance required by each class is determined). Thus, the host apparatus 20 reads the class, thereby knowing the write performance Pw.

Information in the performance identification code register 24 and the performance parameter register 25 may be output to the host apparatus 20 when the memory card 19 receives a predetermined command from the host apparatus 20.

The value set in the performance identification code register 24 and the performance parameter register 25 may be written as a previously calculated value in manufacture or may be determined by the memory card 19 in initialization.

The current SD™ memory card has no means (dedicated register) for displaying the performance parameter. The performance code and performance parameters may be added to a reserve area of a programmable register. The host apparatus detects the performance code to know the performance of the card. Therefore, the current SD™ memory card is usable without changing the current card controller.

[4] Operation Sequence of Host Apparatus when Executing Real-Time Recording and Requirements

[4-1] Operation Sequence of Host Apparatus when Executing Real-Time Recording

When executing real-time recording, the host apparatus 20 carries out a write operation while executing calculations according to the following sequence using the performance curve, class and parameters. Preferably, the host apparatus 20 carries out the following sequence when executing real-time recording.

(1) Determine performance (hereinafter, referred to as application performance) Pa requested from application included in the host apparatus 20.

(2) Select a proper number Nd of write RUs between file system updates.

(3) Determine a card performance Pc required for realizing the application performance Pa, considering file system update.

(4) Determine the maximum used RU ratio r(Pc).

(5) Classify AU 31 into $AU_{fast}$ and $AU_{slow}$.

(6) Estimate available record time $T_{rec}$.

(7) Adjust the number Nd of RUs written between file system updates. When the number Nd of RUs written between file system updates is larger, performance improves.

(8) When sufficient performance and sufficient available record time are not obtained after these calculations, card erase is required.

The specific method of carrying out the operations (1) to (8) and the requirements of the host apparatus 20 will be described below.

[4-2] Performance Calculation Method with File System Update

A typical file system (FAT) update cycle sequence in real time recording is as shown in FIG. 7. It is preferable that the host apparatus 20 carries out the sequence in the file system update.

[4-2-1] Card Performance Conditions Considering File System Update

The host apparatus 20 determines the card performance Pc required for satisfying Pa from the application performance Pa and average file system write time $T_{FW}$. As described above, the file system write sequence is inserted, and thereby, the total write performance worsens. Thus, the host apparatus 20 requires a card giving a card performance Pc higher than the application performance Pa in general.

Some of host apparatuses 20 may support some different kinds of bit rate modes in accordance with the kind of application. In this case, the host apparatus 20 determines the application performance Pa in accordance with the mode selected by users.

It is desirable that the host apparatus 20 should not refuse the memory card 19, which does not match with the application performance Pa, but adjust the performance of the host apparatus 20 in accordance with the class of the memory card 19.

For example, when the card performance of a memory card 19 is inferior to the application performance Pa, it is desirable that the host apparatus 20 change a mode to lower one requesting a lower application performance Pa. For example, the data compression ratio may be increased, image resolution may be reduced or the frame rate may be reduced to allow the host apparatus 20 to conform a lower application performance Pa. In order to realize the method, the host apparatus 20 preferably has some kinds of write modes to use memory cards 19 having low performance.

The host apparatus 20 has several modes having different recording performance, and thereby it can keep writing at lower rate mode even if failure occurs. Failure may happen when a class 0 card is used because the host apparatus 20 does not know if it can operate in a certain mode before it actually tries the mode.

The application performance Pa and card performance Pc required for satisfying Pa (hereinafter, card performance) are expressed by the following mathematical expressions 6 and 7, respectively.

Performance requested by application: $Pa=(Sc \times Nd)/(Sc \times Nd/Pc+T_{FW})$ [Mathematical Expression 6]

Card performance Pc required for satisfying $Pc:=(Sc \times Nd \times Pa)/(Sc \times Nd-Pa \times T_{FW})$ [Mathematical expression 7]

The card performance Pc varies depending on the number Nd of write RUs between file system updates.

As seen from FIG. 7, the number Nd of write RUs between file system updates varies depending on a frequency of file system update. Thus, the frequency of file system update affects the card performance Pc. The method of determining the frequency of file system update will be described in the following [4-2-2].

[4-2-2] Condition of File System Update Period

File system (FAT) update time (from file system update to next file system update) is determined by inserting file system write sequence in data transfer. Therefore, the file system update period depends on write speed; however time accuracy is not important. A simple method may be employed so that the host apparatus 20 simply calculates the file system update period.

The file system update period is expressed using the following mathematical expression 8.

File system update period: $T_{PF}=Sc \times Nd/Pa=Sc \times Nd/Pc+T_{FW}(ave)$ [Mathematical expression 8]

The host apparatus 20 may adjust the number of RUs written between file system updates considering a reduction of card performance resulting from file system write. In this case, the file system update period $T_{PF}$ is preferably one second or more.

When a larger number of RUs is selected, the card performance Pc approaches the application performance Pa. By doing so, the memory card 19 having low performance is capable of satisfying the application performance Pa.

The following method is given as another method of determining the file system update period. According to the method, file system update period $T_{FU}$ (equivalent to $T_{PF}$) is determined using a timer included in the host apparatus 20. In this case, $T_{FU}$ is constant. File system update is inserted between RU writes. Thus, the number of RUs written between file system updates varies depending on the file system update period $T_{FU}$.

In this case, the data amount of the file system update period $T_{FU}$ is expressed using the following mathematical expression 9.

Data amount of $T_{FU}$ time: $Pa \times T_{FU}$ [Mathematical expression 9]

Mathematical expression 9 is transformed, and thereby, the card performance Pc is expressed using the following mathematical expression 10.

Card performance for satisfying $Pa:Pc=(Pa \times T_{FU})/(T_{FU}-T_{FW}(ave.))$ [Mathematical expression 10]

[4-3] Classification of Allocation Unit (AU)

The host apparatus 20 determines which AU 31 is available for real time recording. In other words, host apparatus 20 determines whether or not each AU 31 satisfies the requested card performance Pc.

The performance of each AU 31 changes depending on the used RU ratio as seen from FIG. 6. Therefore, each AU 31 is determined using the used RU ratio as a threshold value.

[4-3-1] Maximum Used RU Ratio

Figure 4:
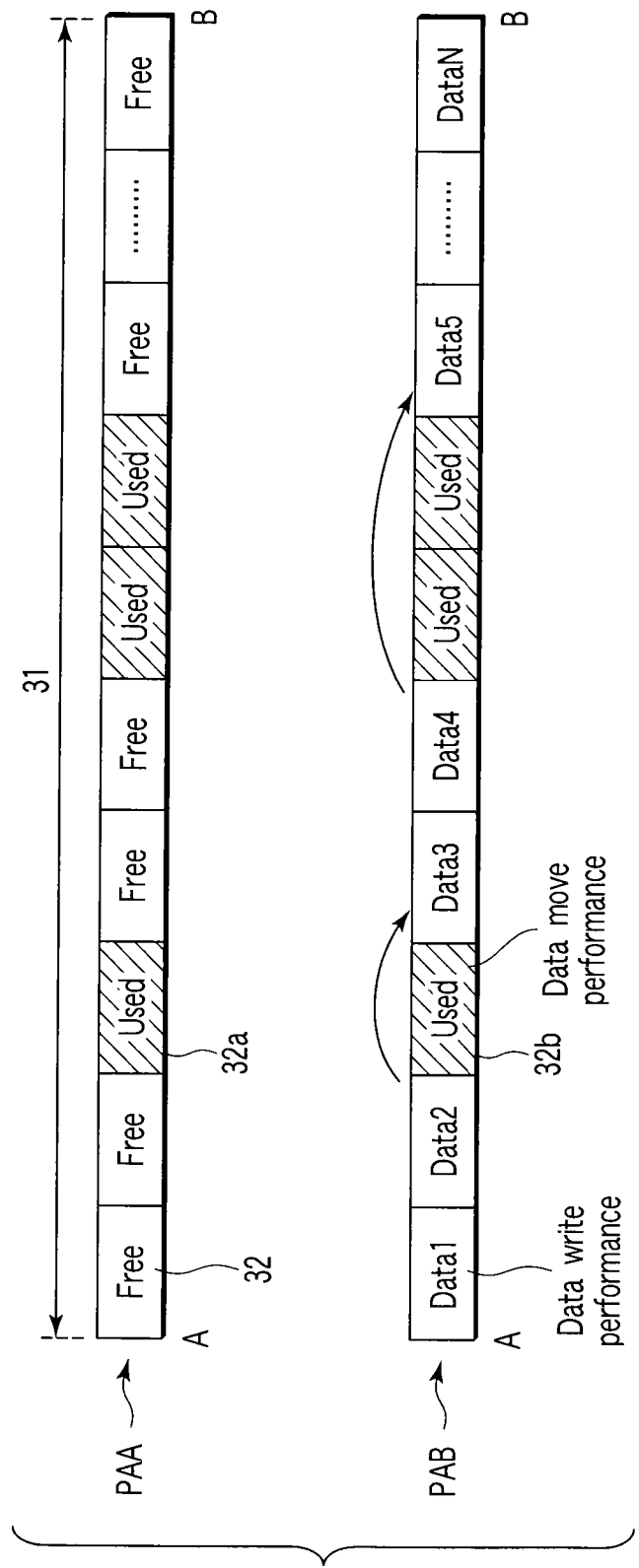
FIG. 4 is a view to explain data move in the first embodiment.

As shown in FIG. 4, if the write start position A and the write end position B are at the boundary of the AU 31, the performance of the AU 31 is calculated using mathematical expression 3.

Thus, it is possible to lead the maximum used RU ratio r(Pc) from the card performance Pc as the inverse function of mathematical expression 3.

AU 31 having a used RU ratio r less than the maximum used RU ratio r(Pc) is an AU 31 satisfying the card performance Pc. The smaller used RU ratio r the AU 31 has, the more suitable to real time recording. The AU 31 is classified into $AU_{fast}$ and $AU_{slow}$ using the maximum used RU ratio r(Pc) as the boundary, as described below.

The maximum used RU ratio r(Pc) is expressed using the following mathematical expression 11.

Maximum used RU ratio:$r(Pc)=[(Pw-Pc)\times Pm]/[(Pw-Pm)\times Pc+Pw\times Pm]$    [Mathematical expression 11]

[4-3-2] Classification of AU into Two Categories

The host apparatus 20 classifies the AU 31 into two categories. One is $AU_{fast}$ (adaptive management unit area). This AU 31 has a rate sufficient to executing real-time recording with the card performance Pc. Another is $AU_{slow}$ (non-adaptive management unit area). This AU 31 is not suitable to real-time recording because the memory area is too fragmented.

The host apparatus 20 counts the number Nu of used RUs for each AU 31, and thereafter, calculates a used RU ratio r from the number Nu of used RUs. It is determined whether the AU is $AU_{fast}$ or is $AU_{slow}$ using the following mathematical expression 12.

If $Nu/Nt<r(Pc)$, AU is $AU_{fast}$

If $Nu/Nt \geq r(Pc)$, AU is $AU_{slow}$    [Mathematical expression 12]

Specifically, if (number Nu of used RUs)/(total number Nt of RUs in AU) is less than the maximum used RU ratio r(Pc), AU is classified as $AU_{fast}$. On the other hand, if the Nu/Nt is equal to or more than the maximum used RU ratio r(Pc), AU is classified as $AU_{slow}$.

Figure 14:
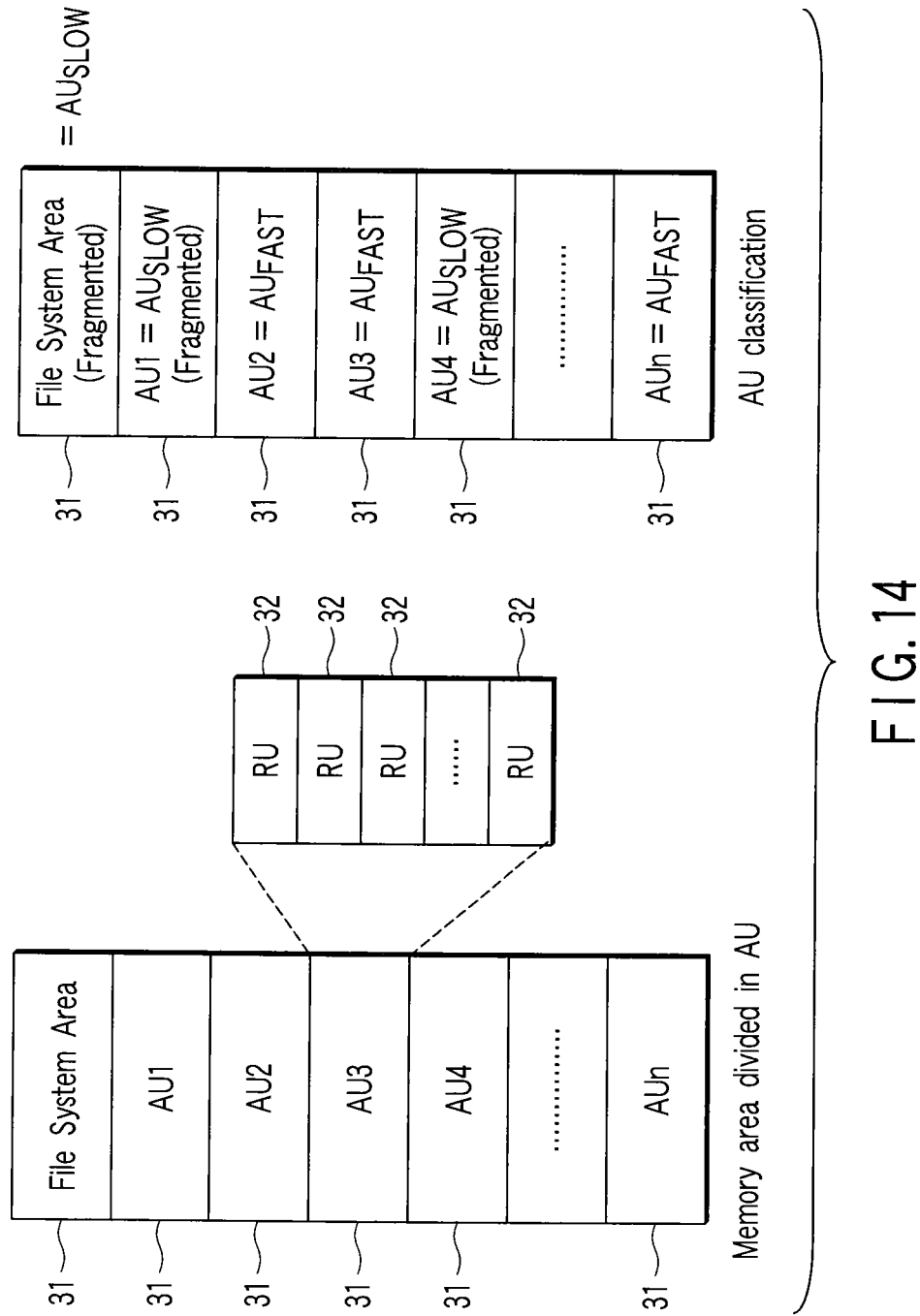
FIG. 14 is a view showing AU classification with respect to a memory card area in the first embodiment.

FIG. 14 shows allocation of the AU 31 in the memory area 21, and shows distribution in the two kinds of memory area 21 of the AU 31. The uppermost AU 31 includes file system; for this reason, it is an area, which is not suitable to real time recording. Therefore, the uppermost AU 31 is classified as $AU_{slow}$. Moreover, directory entry should not be created in the AU 31 recording data.

AU1 and AU4 do not include file system; however, it is determined that they are too fragmented because the (number Nu of used RUs)/(total number Nt of RUs in AU) is more than the maximum used RU ratio r(Pc).

[4-4] Available Record Time

The host apparatus 20 can calculate available time for real time recording using the following mathematical expression 13. In the expression, Nr represents the number Nr of available RUs 32 of all AUs 31 determined as $AU_{fast}$. If sufficient available record time is not prepared, the host apparatus 20 gives users instructions to transfer recorded data to another place, or reformats the memory card 19.

Available record time: $T_{REC}=Sc\times Nr/Pa$    [Mathematical expression 13]

The host apparatus 20 again calculates the available record time when it sets the number Nd of write RUs between file system updates, that is, file system update period $T_{PF}$ larger. This is because larger number Nd of RUs between file system updates improves the performance. In other words, the maximum used RU ratio r(Pc) value is increased and the number of $AU_{fast}$ increases; therefore, available record time increases.

[4-5] Requirements for Host Buffer

The host buffer 27 must have a capacity enough to temporarily store data. The host buffer 27 must meet the following requirements.

[4-5-1] Size Requirements of Host Buffer

The host buffer 27 needs to have a capacity satisfying the following requests.

(1) Request from File System (FAT) Update

When the host apparatus 20 updates file system, the host buffer 27 is used for temporarily storing data which is supposed to be written during file system write. For this reason, a large buffer size is required. The buffer size is specified as the maximum value $T_{FW}(max)$ of the file system write time. For example, the maximum value $T_{FW}(max)$ of the file system write time is 750 [ms] as seen from the mathematical expression 5. In general, the buffer size is represented as record time data in which the buffer can store.

(2) Request from Error Correction

The host buffer 27 is used to complement a delay when correcting a write data error. If a write error occurs, the memory card 19 does not return the CRC status or stop multi-block write and display an error occurrence. The host buffer 27 needs to store data until write is completed to allow rewrite to be executed if an error occurs.

The host buffer 27 must have a proper size, for example 250 [ms], so that the host apparatus 20 continues real-time recording even if an error occurs. This is because the value 250 [ms] is specified as the maximum time to complete write. Therefore, the size is required in combination with the maximum value $T_{FW}(max)$ of the file system write time. If the maximum value $T_{FW}(max)$ of the file system write time is 750 [ms], a buffer capable of storing data equivalent to 1 [s] in total is required.

(3) Request from AU Write Delay Compensation

If written RUs 32 exist in the AU31 including the case where used RUs 32 gather in the upper portion of the AU 31, data can not be written unless data stored in used RU 32 is moved to another RU 32. Therefore, write data must be stored in the host buffer 27 while written RU 32 is moved.

Figure 15:
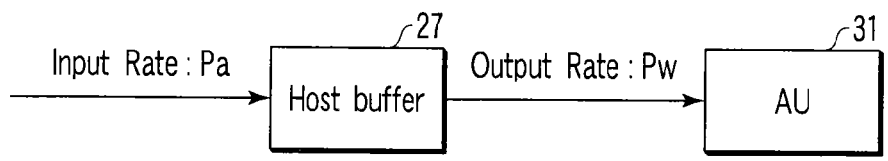
FIG. 15 is a view to explain the concept of a host buffer in the first embodiment.

FIG. 15 shows the concept of the host buffer 27. As shown in FIG. 15, it is assumed that data is continuously input to the host buffer 27 from the host apparatus 20 at a fixed rate Pa and the host apparatus 20 reads data stored in the host buffer 27 to write the data to AU 31.

On the other hand, the rate of the data output from the host buffer 27 depends on a fragmented state of the AU 31. Specifically, if written RU 32 exists in the AU 31 as described above, write data is held by the host buffer; therefore, it is not output. If no written RU 32 exists in the AU 31, or when the move of RU 32 is completed, the host buffer 27 outputs data at a rate Pw.

As seen from the description, the size required for the host buffer 27 is determined from how long it takes to move all used RUs 32 in the AU 31.

If the size of the host buffer 27 becomes insufficient, overflow (buffer shortage) of the host buffer 27 may occur depending on a data fragmented state in the $AU_{fast}$. For this reason, consideration may be further required in accordance with the size of the host buffer 27 and the data fragmented state of the $AU_{fast}$.

(4) Preparation for Write Data

It takes the host apparatus 20 certain time to prepare write data, and thus, the write data is discretely generated. In this case, the data may be once stored in the buffer 27 and may be written by the host controller 26. By doing so, transfer can be carried out continuously; therefore, effective transfer can be achieved.

Particularly, in real-time recording, real time data is once stored in the host buffer 27 functioning as FIFO, and thereafter, written to the memory card 19. By doing so, it is possible to hinder time spent for preparing (calculating) the real time data. In other words, data is effectively recorded to the memory card 19.

If data is directly written to the memory card 19 after being calculated on the system memory, the procedure is sequential. For this reason, data calculation and write must be alternately carried out. If the alternative operation is executed, no data can be written to the memory card 19 during the calculation, and thereby, the memory card 19 performs worse than the class it presents.

The required buffer size is represented as a function using the application performance Pa, move performance Pw, maximum used RU ratio r(Pc) and AU size $S_{Au}$.

In the following mathematical expression 14, the required buffer size $S_{BUF}$ is shown. In the expression 14, the first item (Pa) of the right side corresponds to the description of the columns (1) and (2). The second item of the right side corresponds to the description of the column (3). The description of the column (4) is not included in mathematical expression 14. Moreover, an additional buffer may be required depending on the standards of the host apparatus 20.

Required buffer size:$S_{BUF} > Pa + [r(Pc) \times S_{AU} \times Pa]/Pm$  [Mathematical expression 14]

If the application performance Pa is smaller than the move performance Pm and the host buffer 27 has a large size exceeding $(Pa+S_{Au})$, mathematical expression 14 is always satisfied.

[4-5-2] Handling when Host Buffer Size is Small

Independently from the foregoing discussion, the following is an explanation about the method of finding $AU_{fast}$ having a small fragmented degree if the size of the host buffer 27 is insufficient. It is preferable that the host buffer 27 has a sufficient size rather than taking the method described herein.

Figure 16:
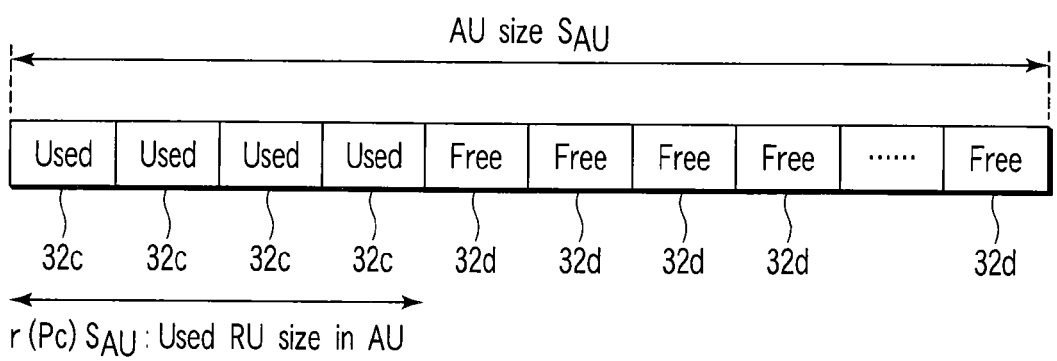
FIG. 16 is a view showing the case where all used RUs are collected onto the front position of AU.

FIG. 16 shows the case where all used RUs 32 gathers in the upper portion of the AU 31. The maximum used RU ratio r(Pc) represents a boundary, which is divided by used RU 32c and free RU 32d. When the host apparatus 20 writes data to the first free RU 32d, the memory card 19 outputs long busy until all used RUs 32c are fully moved. For this duration, write data is stored in the host buffer 27. In this case time required to move all used RUs 32c in the AU 31 is expressed as follows.

$(r(Pc) \times S_{AU})/Pm$

Therefore, the size of the host buffer 27 required in this case is expressed by the following mathematical expression 15.

Host buffer size:$S_{BUF} > Pa \times [(r(Pc) \times S_{AU})/Pm]$  [Mathematical expression 15]

The following mathematical expression 16 is obtained from mathematical expression 15.

Used RU ratio limited by host buffer size=$r(Pc) < [(Pm \times S_{BUF})/(Pa \times S_{Au})]$  [Mathematical expression 16]

As seen from mathematical expression 16, if the size of the host buffer 27 is small, the maximum used RU ratio r(Pc) is limited by the size of the host buffer 27. In this case, the AU 31 must be classified using the maximum used RU ratio r(Pc) limited by the size of the host buffer 27 as r(Pc) in mathematical expression 12.

Moreover, if the size of the host buffer 27 is small, the size of data stored in the host buffer 27 during real-time data recording is observed. In accordance with the observed result, control may be carried out so that data bit rate is temporarily made smaller, or file system update period may be controlled to previously prevent buffer overflow. There is a problem that the host buffer 27 overflows; as a result, data is lost. For this reason, data loss must be prevented even if data quality deteriorates.

If recording is made using write performance predicted based on performance information (performance parameter) of the storage device 19, the host apparatus 20 makes a mode change. Specifically, when buffer overflow occurs or an error frequently occurs during access of the storage device 19, the host apparatus 20 makes a change to a lower speed mode than the speed based on the performance information of the storage device 19.

[4-6] Others

The host apparatus 20 may have a means for comparing performance information (e.g., class, performance parameter) with its performance information (same as above).

The host apparatus 20 may be provided with a comparison means for comparing performance information read from the memory card 19 with its own performance information. This is based on the following reason. For example, even if one of the memory card 19 and the host apparatus has a very high performance, the other one may not have performance equivalent to above. In such a case, the slower performance limits data transfer between the host apparatus 20 and the memory card 19 after all.

Performance that users expect may not be obtained when a lower class memory card 19 is used. In order to avoid the disadvantage, the host apparatus 20 may compare performance information read from the memory card 19 with its performance information and inform users of the result via display.

For example, the memory card 19 is inserted into the host apparatus 20, and thereafter, the host apparatus 20 displays the following message on the screen. That is, "This apparatus belongs to class M; however, operation based on class N (N<M) is executed because inserted memory card class is N". By doing so, users can grasp why an expected operation speed is not obtained even if class N memory card is used. The screen display may be automatically made after the memory card 19 is inserted into the host apparatus 20 or users may make a predetermined operation to make the message appear on the screen.

The performance information comparison function described above is not essential for the host apparatus 20 to use the memory card 19 storing performance information.

Second Embodiment

An SD™ memory card to which the first embodiment is applicable will be explained below.

FIG. 17 is a schematic view showing the configuration of an SD™ memory card according to a second embodiment of the present invention. An SD™ memory card (hereinafter, referred simply to as memory card) 41 exchanges information with the host apparatus 20 via a bus interface 45. The memory card 41 includes NAND Flash™ memory (hereinafter, referred simply to as flash memory) chip 42, card controller 43 controlling the flash memory chip 42, and several signal pins (first to ninth pins) 44. A reference numeral 45 denotes a bus interface.

The card controller 43 is equivalent to the device controller 22 of the first embodiment (see FIG. 2). The flash memory 42 is equivalent to the memory area 21 of FIG. 2.

The signal pins 44 are electrically connected to the card controller 43. Signal allocation to signal pins 44, that is, first to ninth pins are as shown in FIG. 18.

Data 0 to data 3 are allocated to seventh, eighth, ninth and first pins, respectively. The first pin is also allocated to a card detection signal. The second pin is allocated to a command. The third and sixth pins are allocated to ground potential Vss, and the fourth pin is allocated to power supply potential Vdd. The fifth pin is allocated to a clock signal.

The memory card 41 can be inserted to a slot formed in the host apparatus 20. The host controller 26 (not shown) of the host apparatus communicates various signals and data with the card controller 43 of the memory card 41 via the first to ninth pins. For example, when data is written to the memory card 41, the host controller 26 sends a write command to the card controller 43 as a serial signal via the second pin. In this case, the card controller 43 fetches the write command given to the second pin in response to a clock signal supplied to the fifth pin.

As described above, the write command is serially input to the card controller 43 using the second pin only. The second pin allocated to command input is interposed between the first pin for data 3 and the third pin for ground potential Vss. The bus interface 45 corresponding to several signal pins 44 is used for communications of the host controller 26 of the host apparatus 20 with the memory card 41.

On the other hand, communications of the flash memory 42 with the card controller 43 are executed via a NAND Flash™ memory interface. Therefore, although not shown here, the flash memory 42 and the card controller 43 are connected via an 8-bit input/output (I/O) line.

For example, when writing data to the flash memory 42, the card controller 43 successively inputs the following information to the flash memory 42 via the I/O line. The information includes data input command 80H, column address, page address, data and program command 10H. "H" of the command 80H represents a hexadecimal numeral, and actually, an 8-bit signal "10000000" is supplied in parallel to the 8-bit I/O line. Namely, several-bit command is supplied in parallel via the NAND Flash™ memory interface.

In the NAND Flash™ memory interface, command and data to the flash memory 42 are communicated on the same I/O line. Thus, the interface used for communications of the host controller 26 of the host apparatus 20 with the memory card 41 differs from that used for communications of the flash memory 42 with the card controller 43.

FIG. 19 is a block diagram showing the hardware configuration of the memory card according to the second embodiment.

The host apparatus 20 includes hardware and software for accessing the memory card 41 connected via the bus interface 45. The memory card 41 operates when being connected to the host apparatus and receiving power supply, and then, takes procedures in accordance with access from the host apparatus 20.

The memory card 41 includes the flash memory 42 and the card controller 43 as described above. In the flash memory 42, an erase block size (i.e., block size at a unit of erase) in the erase operation is set to a predetermined size (e.g., 256 kB). Moreover, data write and read are carried out at a unit called page (e.g., 2 kB).

The card controller 43 manages a physical state in the flash memory 42 (for example, which logical sector address data is included in which physical block address, or which block is erased). The card controller 43 has a host interface module 53, micro processing unit (MPU) 54, flash controller 55, read only memory (ROM) 56, random access memory (RAM) 57 and buffer 58.

Figure 20:
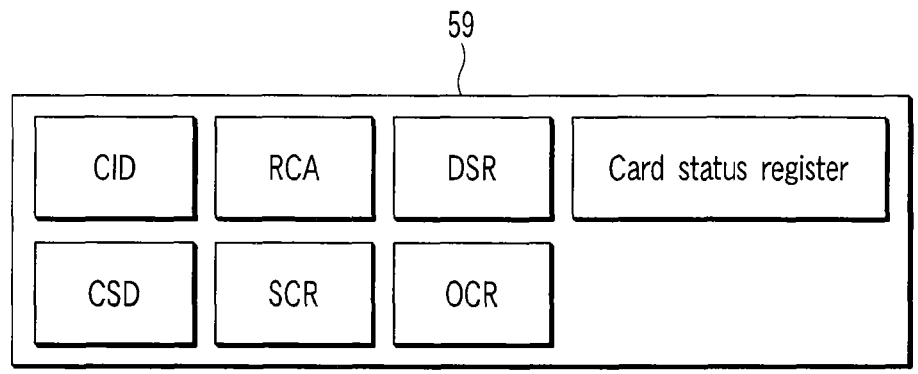
FIG. 20 is a block diagram showing the configuration of a register of the memory card of the second embodiment.

The host interface module 53 interfaces between the card controller 43 and the host apparatus 20, and includes a register 59. FIG. 20 is a block diagram showing the configuration of the register 59. The register 59 has card status register, and registers such as CID, RCA, DSR, CSD, SCR and OCR.

The registers are defined as follows. The card status register is used in a normal operation, and for example, stores error information described later. Registers CID, RCA, DSR, CSD, SCR and OCR are mainly used when the memory card is initialized.

The card identification number (CID) stores the identification number of the memory card 41. The relative card address (RCA) stores with relative card address (dynamically determined by the host apparatus in initialization). The driver stage register (DSR) stores a bus drive force of the memory card.

The card specific data (CSD) stores characteristic parameter values of the memory card 41. The CSD further holds version information, performance identification code and performance parameter described in the first embodiment.

The SD configuration data register (SCR) stores the data array of the memory card 41. The operation condition register (OCR) stores an operating voltage of the memory card 41 having a limited operating range voltage.

The MPU 54 controls the entire operation of the memory card 41. When the memory card 41 receives power supply, the MPU 54 reads firmware (control program) stored in the ROM 56 onto the RAM 57 to execute predetermined processes. By doing so, the MPU 54 prepares various tables on the RAM 57.

The MPU 54 also receives write, read and erase commands to execute predetermined processes to the flash memory 42, or controls data transfer via the buffer 58.

The ROM 56 stores control programs controlled by the MPU 54. The RAM 57 is used as a work area of the MPU 54, and stores control programs and various tables. The flash controller 55 interfaces between the card controller 43 and the flash memory 42.

The buffer 58 temporarily stores a predetermined amount of data (e.g., one page) when writing data sent from the host apparatus 20 to the flash memory 42 and temporarily stores a predetermined amount of data when sending data read from the flash memory 42 to the host apparatus 20.

Figure 21:
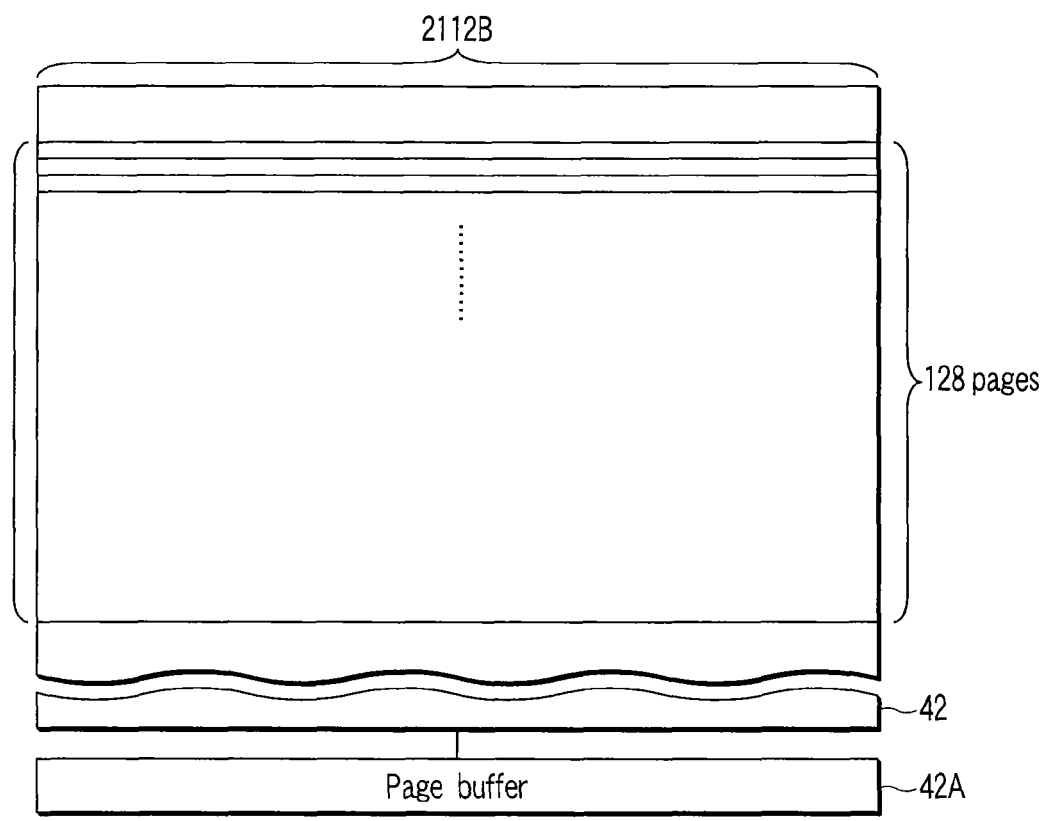
FIG. 21 is a view showing the configuration of the memory cell and the buffer in the memory card of the second embodiment.

FIG. 21 shows the data array of the flash memory 42 in the memory card 41. Each page of the flash memory 42 has 2112 Bytes (512-byte data memory area×4+10-byte redundancy area×4+24-byte management data memory area). 128 pages are one erase unit (256 kB+8 kB (k is 1024). In the following description, the erase unit of the flash memory 42 is set to 256 kB for convenience of explanation.

The flash memory 42 includes a page buffer 42A for inputting and outputting data to the flash memory 42. The memory capacity of the page buffer 42A is 2112 bytes (2048 B+64 B). In data write, the page buffer 42a carries out data input/output to the flash memory 42 at a unit of one page equivalent to its own memory capacity.

If the flash memory has memory capacity of 1 Gb, the number of 256-kB blocks (erase unit) is 512.

FIG. 21 shows the case where the erase unit is 256 kB; however, it is practically effective to build up an erase unit of 16 kB. In this case, each page has 528 B (512-Bytes data memory area+16-Bytes redundancy area), and 32 pages are one erase unit (16 kB+0.5 kB).

The area (data memory area) to which data of the flash memory 42 is written is divided into several areas in accordance with stored data as shown in FIG. 19. The flash memory 42 has the following data memory areas, that is, management data area 61, confidential data area 62, protection data area 63 and user data area 64.

The management data area 61 mainly stores management information relevant to memory card, that is, security information of the memory card 41 and card information such as media ID.

The confidential data area 62 stores key information used for encryption and confidential data used for authentication, and is an area, which is not accessible from the host apparatus 20.

The protection data area 63 stores significant data, and is an area, which is accessible only when the host apparatus 20 is validated though the mutual authentication with the host apparatus 20 connected to the memory card 41.

The user data area 64 stores user data, and is an area, which is freely accessible and available to users of the memory card 41.

The explanation on second embodiment is directed to the case where the operation mode of the memory card 41 is a SD 4-bit mode. The present invention is applicable to the case where the operation mode of the memory card 41 is SD 1-bit mode and SPI mode. FIG. 22 shows signal allocation corresponding to signal pins in the SD 4-bit mode, SD 1-bit mode and SPI mode.

The operation mode of the memory card 41 is largely classified into SD mode and SPI mode. In the SD mode, the memory card 41 is set to SD 4-bit mode or SD 1-bit mode according to a bus width change command from the host apparatus 20.

Four pins, data0 pin (DAT0) to data3 pin (DAT3) all are used for data transfer in the SD 4-bit mode, which transfers data in units of 4-bit width.

In the SD 1-bit mode, which transfers data transfer in units of 1-bit width, the data0 (DAT0) pin only is used for data transfer, and data1 (DAT1) and data2 pin (DAT2) are not used at all. The data3 pin (DAT3) is used, for example, for non-synchronous interrupt to the host apparatus 20 from the memory card 19.

In the SPI mode, the data0 pin (DAT0) is used as a data signal line (DATA OUT) from the memory card 19 to the host apparatus 20. A command pin (CMD) is used as a data signal line (DATA IN) from the host apparatus 20 to the memory card 19. The data1 pin (DAT1) and data2 pin (DAT2) are not used. In the SPI mode, the data3 pin (DAT3) is used for transmitting a chip select signal CS from the host apparatus 20 to the memory card 19.

When the flash memory 42 comprises one chip, the memory card 19 is used for not-so-high-speed operation, and classified as class M (M is zero or positive integer).

When the flash memory 42 has a class N (N is a positive integer larger than M) higher speed than one-chip memory card 19, some flash memory chips 42 may comprise some chips in the memory card 19. By doing so, the card controller writes data to one flash chip memory while transferring data to another flash memory chip. Thus, superficial data transfer rate between the card controller 43 and the flash memory 42 improves.

Moreover, a flash memory chip having a page copy (or copy back) function may be employed, and thereby, data stored in a page of the flash memory chip is copied to another page of the same flash memory chip. By doing so, the move performance Pm improves.

The present invention is described on the basis of the first and second embodiments; however, the present invention is not limited to the scope. A digital still camera, digital video camera, PC and PDA are given as a host apparatus to which the present invention is applicable.

In addition to the NAND Flash™ memory, AND flash memory, NOR Flash™ memory, that is, memories having a floating gate as a charge memory layer may be used as a semiconductor memory used as the storage device of the first and second embodiments. Moreover, memories having a MONOS insulating layer as a charge memory layer may be used. Moreover, non-volatile semiconductor memories such as a magnetic random access memory (MRAM) and ferromagnetic random access memory (FeRAM) may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A storage device comprising:
   a semiconductor memory which has memory areas, a part of the memory areas being assigned to a user area which can be accessed from outside, the user area including allocation units (AUs), each management unit including recording units (RUs);
   a controller instructing to write data to the semiconductor memory in accordance with a request the controller receives;
   a first register provided in the controller and holding a class value corresponding to a performance class of the storage device; and
   a second register provided in the controller and holding information of a size of an AU, the size of the AU being memory management information used to manage the user area, wherein
   a worst average write performance of the storage device, which is an average of measured sequential writes performance, is larger than or equal to performance specified by the class value held in the first register,
   a write size of each of the sequential writes is a size of one of the RUs, and
   the first and second registers are accessible from outside.

2. The device according to claim 1, wherein the second register further holds information on performance of internal data move by the storage device.

3. The device according to claim 1, wherein the storage device is configured to maintain average write performance larger than or equal to the performance determined by the performance class even with a file information update inserted during writes to RUs.

4. The device according to claim 1, further comprising:
   a cover covering the semiconductor memory and the controller; and
   a display portion provided on the cover and displaying the performance class.

5. A storage device comprising:
   a semiconductor memory which has memory areas, a part of the memory areas being assigned to a user area which can be accessed from outside, the user area including allocation units (AUs), each management unit including recording units (RUs);
   a clock input terminal to receive a clock having a frequency, performance of a bus of the storage device depending on the frequency;
   a controller instructing to write data to the semiconductor memory in accordance with a request the controller receives;
   a first register provided in the controller and holding a class values value corresponding to a performance class of the storage device related to the frequency of the clock;

a second register provided in the controller and holding information of a size of an AU, the size of the AU being memory management information used to manage the user area, wherein a worst average write performance of the storage device, which is an average of measured sequential writes performance, is larger than or equal to performance specified by the class value held in the first register, a write size of each of the sequential writes is a size of one of the RUs and the first and second registers are accessible from outside.

6. The device according to claim 5, wherein the second register further holds information on performance of internal data move by the storage device.

7. The device according to claim 5, wherein the storage device is configured to maintain average write performance larger than or equal to the performance determined by the performance class even with a file information update inserted during writes to RUs.

8. The device according to claim 5, further comprising:
a cover covering the semiconductor memory and the controller; and
a display portion provided on the cover and displaying the performance class.

* * * * *